United States Patent
Nebashi et al.

(10) Patent No.: US 9,100,013 B2
(45) Date of Patent: Aug. 4, 2015

(54) NONVOLATILE RESISTOR NETWORK ASSEMBLY AND NONVOLATILE LOGIC GATE WITH INCREASED FAULT TOLERANCE USING THE SAME

(75) Inventors: Ryusuke Nebashi, Tokyo (JP); Noboru Sakimura, Tokyo (JP); Yukihide Tsuji, Tokyo (JP); Tadahiko Sugibayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/344,446

(22) PCT Filed: Sep. 6, 2012

(86) PCT No.: PCT/JP2012/073389
§ 371 (c)(1),
(2), (4) Date: Mar. 12, 2014

(87) PCT Pub. No.: WO2013/047213
PCT Pub. Date: Apr. 4, 2013

(65) Prior Publication Data
US 2015/0042376 A1   Feb. 12, 2015

(30) Foreign Application Priority Data

Sep. 27, 2011   (JP) ................... 2011-210552

(51) Int. Cl.
| H03K 19/00 | (2006.01) |
| H03K 19/173 | (2006.01) |
| H03K 19/177 | (2006.01) |
| H03K 19/18 | (2006.01) |
| G11C 11/16 | (2006.01) |
| G11C 19/08 | (2006.01) |

(52) U.S. Cl.
CPC .......... H03K 19/17764 (2013.01); G11C 11/16 (2013.01); G11C 11/1675 (2013.01); G11C 19/0808 (2013.01); H03K 19/1776 (2013.01); H03K 19/18 (2013.01)

(58) Field of Classification Search
None
See application file for complete search history.

(56) References Cited

U.S. PATENT DOCUMENTS

| 6,169,689 | B1 * | 1/2001 | Naji ............................. 365/173 |
| 6,512,689 | B1 | 1/2003 | Naji et al. |
| 2010/0302832 | A1 | 12/2010 | Berger et al. |

FOREIGN PATENT DOCUMENTS

| JP | 2003-157671 A | 5/2003 |
| JP | 2005-520271 A | 7/2005 |
| JP | 2005-235307 A | 9/2005 |
| JP | 2010-279035 A | 12/2010 |
| JP | 2012-18964 A | 1/2012 |

OTHER PUBLICATIONS

International Search Report of PCT/JP2012/073389, dated Nov. 20, 2012.

* cited by examiner

*Primary Examiner* — Jany Richardson
(74) *Attorney, Agent, or Firm* — Sughrue Mion, PLLC

(57) ABSTRACT

Provided is a nonvolatile resistor network assembly characterized by that: it comprises a first and a second resistor network which are each composed of a plurality of nonvolatile resistive elements connected together; it also comprises a write means for writing into the first and second resistor networks; and writing into the first and second resistor networks is performed by the use of the write means in a manner to make total resistances of respectively the first and second resistor networks different from each other. Further provided is a nonvolatile logic gate which performs logical operation using stored data determined by the total resistances of the respective nonvolatile resistor networks.

16 Claims, 29 Drawing Sheets

Fig. 6

| IDENTIFICATION NUMBER | R1 | R3 | R2 | R4 | Rc(R1,R3) | Rc(R2,R4) | Rc(R1,R3)−Rc(R2,R4) | D | NUMBER OF FAULT RESISTOR ELEMENTS (MINIMUM) |
|---|---|---|---|---|---|---|---|---|---|
| 1 | RL | RL | RL | RL | 2·RL | 2·RL | 0 | × | 2 |
| 2 | RL | RL | RL | RH | 2·RL | RL+RH | −dR | 0 | 1 |
| 3 | RL | RL | RH | RL | 2·RL | RL+RH | −dR | 0 | 1 |
| 4 | RL | RL | RH | RH | 2·RL | 2·RH | −2·dR | 0 | 0 |
| 5 | RL | RH | RL | RL | RL+RH | 2·RL | dR | 1 | 1 |
| 6 | RL | RH | RL | RH | RL+RH | RL+RH | 0 | × | 2 |
| 7 | RL | RH | RH | RL | RL+RH | RL+RH | 0 | × | 2 |
| 8 | RL | RH | RH | RH | RL+RH | 2·RH | −dR | 0 | 1 |
| 9 | RH | RL | RL | RL | RL+RH | 2·RL | dR | 1 | 1 |
| 10 | RH | RL | RL | RH | RL+RH | RL+RH | 0 | × | 2 |
| 11 | RH | RL | RH | RL | RL+RH | RL+RH | 0 | × | 2 |
| 12 | RH | RL | RH | RH | RL+RH | 2·RH | −dR | 0 | 1 |
| 13 | RH | RH | RL | RL | 2·RH | 2·RL | 2·dR | 0 | 0 |
| 14 | RH | RH | RL | RH | 2·RH | RL+RH | dR | 1 | 1 |
| 15 | RH | RH | RH | RL | 2·RH | RL+RH | dR | 1 | 1 |
| 16 | RH | RH | RH | RH | 2·RH | 2·RH | 0 | × | 2 |

Fig. 8

| IDENTIFICATION NUMBER | R1 | R3 | R2 | R4 | Rc(R1,R3) | Rc(R2,R4) | Rc(R1,R3)−Rc(R2,R4) | D | NUMBER OF FAULT RESISTOR ELEMENTS (MINIMUM) |
|---|---|---|---|---|---|---|---|---|---|
| 1 | RL | RL | RL | RL | RL/2 | RL/2 | 0 | × | 2 |
| 2 | RL | RL | RL | RH | RL/2 | RL/(1+RL/RH) | <0 | 0 | 1 |
| 3 | RL | RL | RH | RL | RL/2 | RL/(1+RL/RH) | <0 | 0 | 1 |
| 4 | RL | RL | RH | RH | RL/2 | RH/2 | <0 | 0 | 0 |
| 5 | RL | RH | RL | RL | RL/(1+RL/RH) | RL/2 | >0 | 1 | 1 |
| 6 | RL | RH | RL | RH | RL/(1+RL/RH) | RL/(1+RL/RH) | 0 | × | 2 |
| 7 | RL | RH | RH | RL | RL/(1+RL/RH) | RL/(1+RL/RH) | 0 | × | 2 |
| 8 | RL | RH | RH | RH | RH/(1+RL/RL) | RH/2 | <0 | 0 | 1 |
| 9 | RH | RL | RL | RL | RL/(1+RL/RH) | RL/(1+RL/RH) | 0 | × | 1 |
| 10 | RH | RL | RL | RH | RL/(1+RL/RH) | RL/(1+RL/RH) | <0 | 0 | 2 |
| 11 | RH | RL | RH | RL | RL/(1+RL/RH) | RL/(1+RL/RH) | >0 | 1 | 2 |
| 12 | RH | RL | RH | RH | RH/(1+RH/RL) | RH/(1+RH/RL) | 0 | × | 1 |
| 13 | RH | RH | RL | RL | RH/2 | RL/2 | >0 | 1 | 0 |
| 14 | RH | RH | RL | RH | RH/2 | RH/(1+RH/RL) | >0 | 1 | 1 |
| 15 | RH | RH | RH | RL | RH/2 | RH/(1+RH/RL) | >0 | 1 | 1 |
| 16 | RH | RH | RH | RH | RH/2 | RH/2 | 0 | × | 2 |

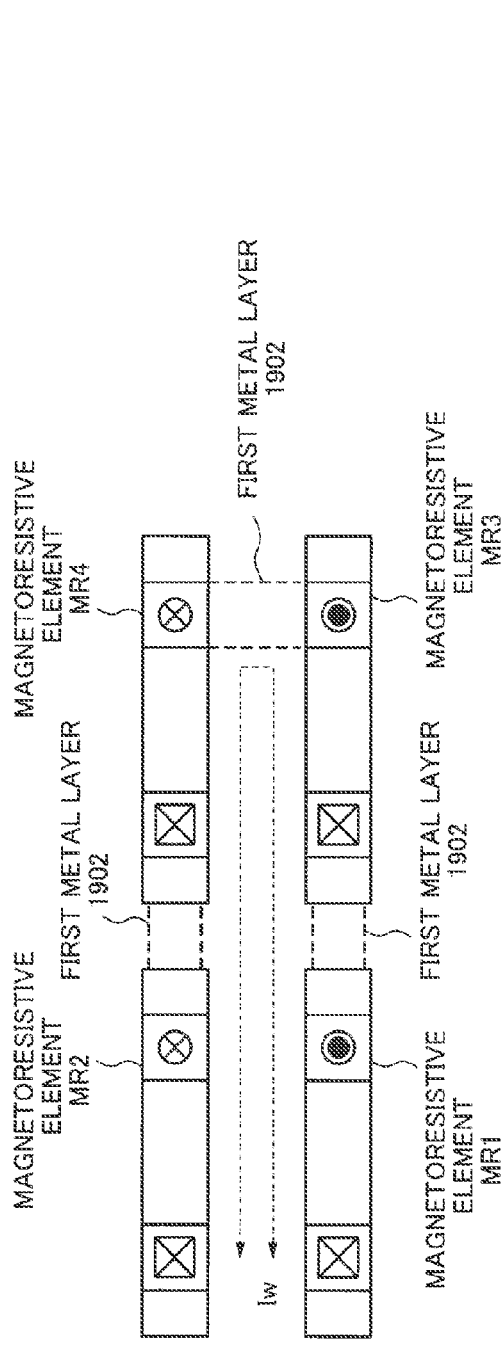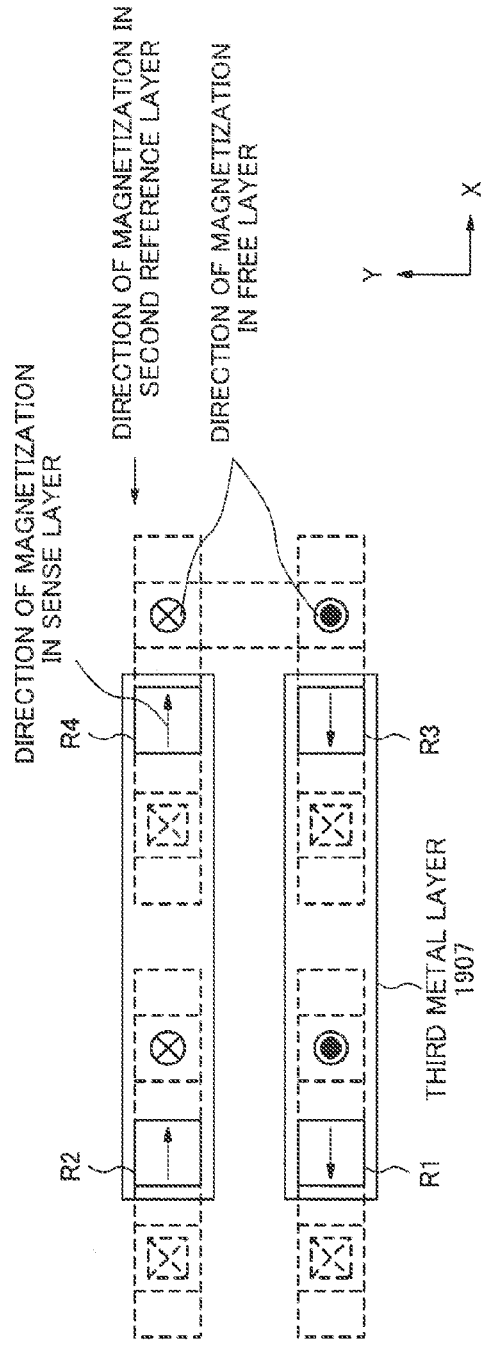

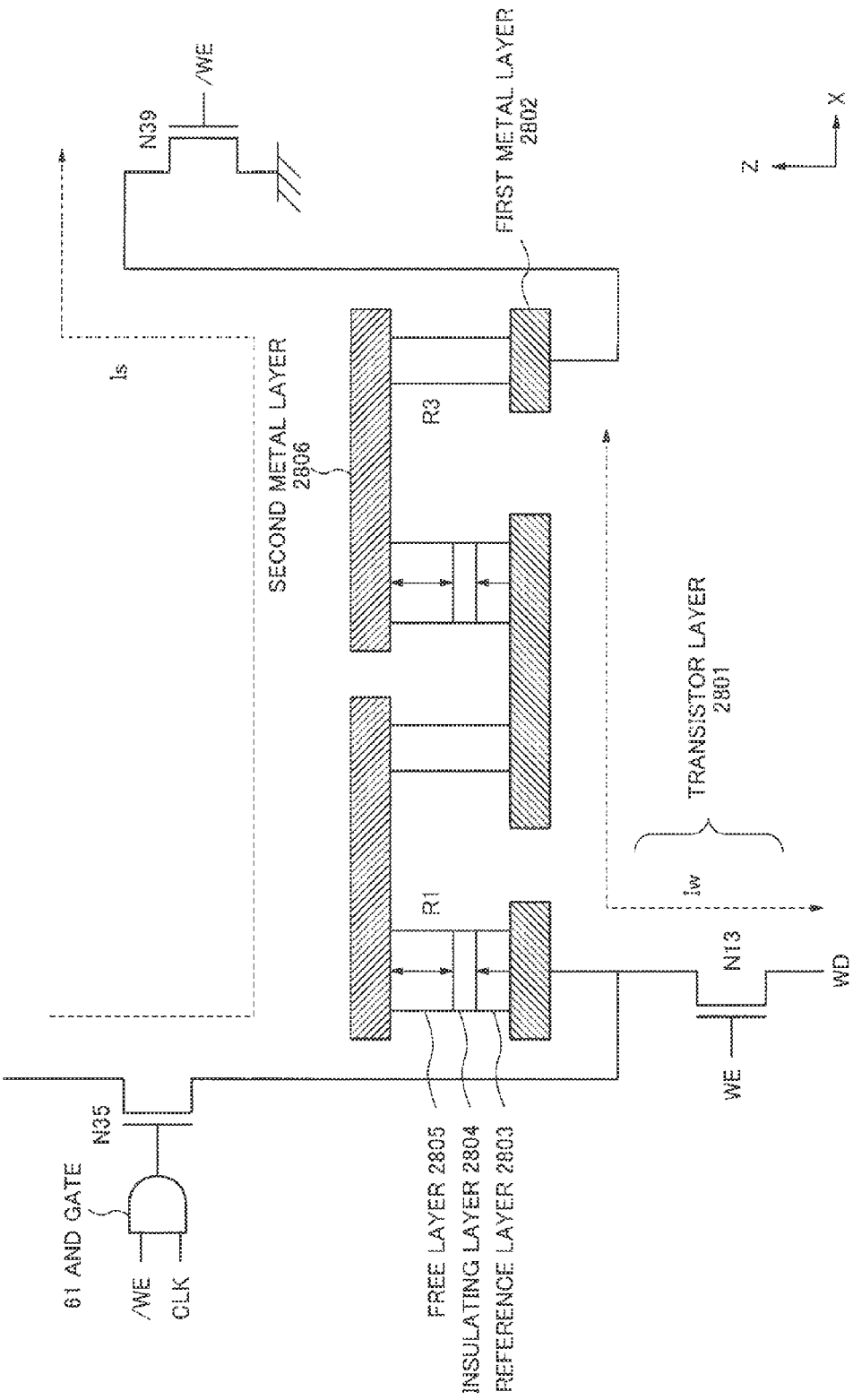

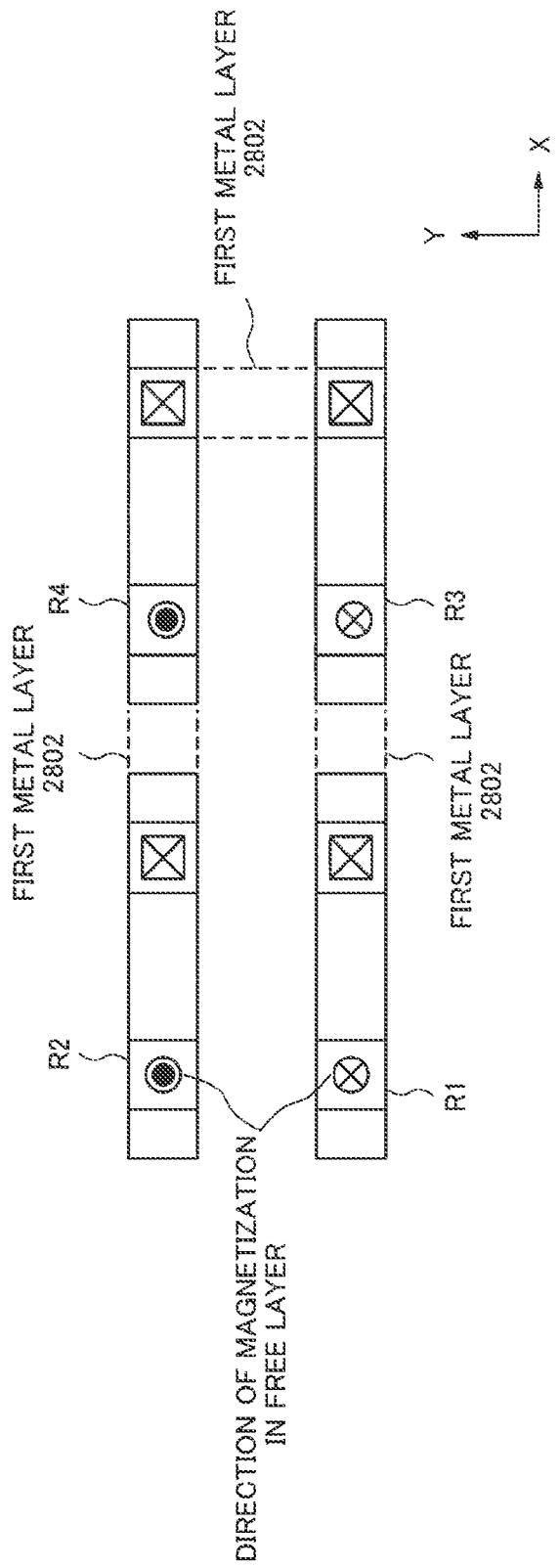

NONVOLATILE RESISTOR NETWORK ASSEMBLY AND NONVOLATILE LOGIC GATE WITH INCREASED FAULT TOLERANCE USING THE SAME

CROSS REFERENCE TO RELATED APPLICATIONS

This application is a National Stage of International Application No. PCT/JP2012/073389 filed Sep. 6, 2012, claiming priority based on Japanese Patent Application No. 2011-210552, filed Sep. 27, 2011, the contents of all of which are incorporated herein by reference in their entirety.

TECHNICAL FIELD

The present invention relates to a nonvolatile resistor network assembly using a variable resistance element such as a magnetic tunnel junction element (MTJ element), and also to a nonvolatile logic gate using the nonvolatile resistor network assembly.

BACKGROUND ART

In recent years, with increasing integration scale of semiconductor devices, there has arisen a problem of increase in the power consumption due to leakage current of the transistors. There have also arisen a problem of data transfer delay resulting from that memory elements are arranged separately from logic elements and a problem of increase in power consumption of wirings for transferring data.

As one method for solving these problems, Patent Document 1 proposes an integrated circuit using a nonvolatile logic gate into which memory elements and logic elements are integrated together. In this integrated circuit, data is not lost even when the power is turned off, because a plurality of nonvolatile resistive elements store the data. Accordingly, because the power may be turned off when the integrated circuit is not in operation, power consumption due to leakage current can be suppressed. Additionally, because memory elements and logic elements are arranged adjacently to each other, the integrated circuit is expected to have small wiring delay and operate with low power consumption.

With reference to FIG. 1, a description will be given below of an example of a configuration of a nonvolatile logic gate 1' which can be used in the above-mentioned integrated circuit. The nonvolatile logic gate 1' illustrated in the drawing comprises an NMOS logic circuit 11' and nonvolatile resistive elements R1 and R2 which store complementary data as their resistance values, and also comprises a through current control circuit 21', a sense circuit 31' and a write circuit 41 used for rewriting data of the nonvolatile resistive elements. The sense circuit 31' is composed of PMOS transistors P1 and P2 for latching output data and two PMOS transistors P3 and P4 used for precharge. The sense circuit 31' is connected to the NMOS logic circuit 11'. Of each of the nonvolatile resistive elements R1 and R2 illustrated in the drawing, one end is connected to the NMOS logic circuit 11', and the other end to the through current control circuit 21'.

Next, a specific description will be given of connection states between the constituent elements of the nonvolatile logic gate 1' shown in FIG. 1. The gate of the PMOS transistor P1 is connected to the drain of the PMOS transistor P2, the drain of the PMOS transistor P4 and the NMOS logic circuit 11', and is also connected to a data output terminal for outputting an output signal /Dout. On the other hand, the gate of the PMOS transistor P2 is connected to the drain of the PMOS transistor P1, the drain of the PMOS transistor P3 and the NMOS logic circuit 11', and is also connected to a data output terminal for outputting an output signal Dout. A clock signal CLK is given to the gate of each of the PMOS transistors P3 and P4. The source of each of the PMOS transistors P1, P2, P3 and P4 is connected to a power supply voltage Vdd.

As the nonvolatile resistive elements R1 and R2 of FIG. 1, for example, considered is a magnetic tunnel junction element (MTJ element) using the magnetoresistive effect. Here, the MTJ element has a structure comprising a ferromagnetic layer whose magnetization direction is varied (free layer), a ferromagnetic layer whose magnetization direction is fixed (fixed layer) and an insulating layer formed between the free layer and the fixed layer. When electric current is applied to such an MTJ element in a direction perpendicular to the film surface, the resistance value varies depending on the directions of magnetization in the free layer and of that in the fixed layer. The resistance value is low when the magnetization in the free layer and that in the fixed layer are parallel with each other, and is high when the two magnetizations are anti-parallel with each other.

Using this property, in the MTJ element, data values are correlated with the resistance values, that is, the directions of magnetization in the free layer. For example, it is defined that the low-resistance state represents data "0" and the high resistive state does data "1". In the nonvolatile logic gate 1', the data values represented by the MTJ element are used for operation.

As methods for writing into such an MTJ element, known are the magnetic field writing method which controls the magnetization direction of the free layer using a current-induced magnetic field and the spin torque writing method which controls the magnetization direction of the free layer using a spin torque effect.

The nonvolatile logic gate 1' shown in FIG. 1 uses data stored in the nonvolatile resistive elements R1 and R2 for its operation. It performs operation using the data stored in the nonvolatile resistive elements R1 and R2 and external input data Din inputted to the NMOS logic circuit 11', and resultantly outputs complementary output signals Dout and /Dout. A designer can determine, through a configuration of the NMOS logic circuit 11', what kind of operation the nonvolatile logic gate 1' is to perform.

Next, a configuration of the through current control circuit 21' connected with the nonvolatile resistive elements R1 and R2 will be described, with reference to FIGS. 2A and 2B. A through current control circuit 21' shown in FIG. 2A comprises an NMOS transistor N1. The drain of the NMOS transistor N1 is connected to one end of each of the nonvolatile resistive elements R1 and R2. The source of the NMOS transistor N1 is grounded, and a clock signal CLK is given to the gate.

On the other hand, a through current control circuit 21' shown in FIG. 2B comprises two NMOS transistors, N1 and N2, and a capacitor C1 whose one end is grounded and the other end is connected to a common connecting node between the NMOS transistors N1 and N2. Further, the drain of the NMOS transistor N1 is connected to one end of each of the nonvolatile resistive elements R1 and R2, and the source is connected to the drain of the NMOS transistor N2 and one end of the capacitor C1. A clock signal CLK is given to the gate of the NMOS transistor N1. On the other hand, the source of the NMOS transistor N2 is grounded, and an inverted clock signal /CLK is given to the gate.

The difference between the two types of the through current control circuits 21' shown in FIGS. 2A and 2B, respectively, is in the presence or absence of through current during logical operation. In the case of the through current control circuit 21' shown in FIG. 2A, when the clock signal CLK is High, steady electric current flows through the nonvolatile resistive elements R1 and R2 and the NMOS transistor N1. On the other hand, in the case of the through current control circuit 21' shown in FIG. 2B, when the clock signal CLK is High, electric current flows through the nonvolatile resistive elements R1 and R2 and the NMOS transistor N1 only during charging of the capacitor C1. Accordingly, power consumption can be comparatively reduced in the case of the circuit 21' shown in FIG. 2B, because of the absence of steady current.

FIG. 3 shows an example of an NMOS logic circuit 11' constituting the nonvolatile logic gate 1', where an NMOS logic circuit (SUM circuit) 11' capable of performing an addition operation is illustrated. The NMOS logic circuit 11' illustrated there comprises eight NMOS transistors N3, N4, N5, N6, N7, N8, N9 and N10, and complementary input signals A and /A, and C and /C are inputted to the gates of the NMOS transistors N3 to N6 and N7 to N10, respectively, as the input signals Din. Depending on the input signals, current paths are formed in the NMOS logic circuit 11'. One of the nonvolatile resistive elements R1 and R2 is electrically connected to the side for outputting the data output Dout of the NMOS logic circuit 11'. The other one of the nonvolatile resistive elements R1 and R2 is electrically connected to the side for outputting the data output /Dout of the NMOS logic circuit 11'. Using the difference between currents flowing through the two current paths, output voltages being the data outputs Dout and /Dout are determined, that is, a logical operation result (output result) is thus determined.

The nonvolatile logic gate 1' constituted by combining the constituent elements shown in FIGS. 1, 2B and 3 operates as follows. Here, the nonvolatile logic gate 1' illustrated in FIG. 1 has a precharge period and an evaluation period, and such operation is a peculiar one which is different from that of a general static CMOS circuit.

First, when the clock signal CLK is Low, the operation is in the precharge period. The NMOS transistor N1 of the through current control circuit 21' (FIG. 2B) enters into the OFF state, and the PMOS transistors P3 and P4 precharge the output Dout and /Dout at the power supply voltage Vdd. The NMOS transistor N2 of the through current control circuit 21' discharges the capacitor C1.

On the other hand, when the clock signal CLK is High, the NMOS transistors N1 and N2 of the through current control circuit 21' (FIG. 2B) enter into the ON and OFF states, respectively, and the PMOS transistors P3 and P4 for precharge (FIG. 1) enters into the OFF state, and the operation thus enters into the evaluation period. Electric charges stored in capacitors (not illustrated) during the precharge period flow into the capacitor C1 of the through current control circuit 21' via two current paths formed within the NMOS logic circuit 11' and the nonvolatile resistive elements R1 and R2 storing complementary resistance values. Because values of the currents flowing through the nonvolatile resistive elements R1 and R2 depend on the resistance values of the nonvolatile resistive elements R1 and R2, respectively, there occurs a difference in electrical potential between the complementary outputs Dout and /Dout. The electrical potential difference is amplified by the PMOS transistors P1 and P2, so that complementary data outputs Dout and /Dout are outputted. Here, in this nonvolatile logic gate 1', the input signals A, /A, C and /C are not allowed to change during the evaluation period where the clock signal CLK is High. As described above, the nonvolatile logic gate 1' has an operation function and a latch function.

Because the nonvolatile logic gate 1' shown in FIGS. 1 to 3 comprises memory elements and logic elements in an integrated form, it has a problem in that error detection and correction of memory data cannot be performed in situ and it is accordingly difficult to increase fault tolerance of the logic gate. As an error of memory data, mentioned is a soft error in which stored data is inverted at very low probability, for example. As a specific example of such a soft error in the case of using an MTJ element as a nonvolatile resistive element, mentioned is data inversion caused by thermal disturbance when thermal stability of the magnetic material used there is low. With respect to such a soft error, a memory being a constituent element of a general integrated circuit usually performs error detection at its reading operation by the use of an error detection circuit. However, in the nonvolatile logic gate disclosed in Patent Document 1 (Japanese Patent Application Laid-Open No. 2005-235307), there is a problem in that, because memory elements and logic elements are integrated together there, when an error detection circuit is employed in the nonvolatile logic gate, every nonvolatile logic gate needs to have one error detection circuit, and accordingly the circuit area overhead becomes large.

In this respect, the objective of the present invention is to provide a nonvolatile logic gate with increased fault tolerance which can perform logical operation correctly even when an error occurs in memory data.

DISCLOSURE OF INVENTION

Provided is a nonvolatile resistor network assembly characterized by that it comprises a first and a second resistor network each composed of a plurality of nonvolatile resistive elements connected together, it also comprises a write means for writing into the first and second resistor networks, and it writes into the first and second resistor networks by the use of the write means in a manner to make total resistance values of the respective resistor networks different from each other. Further provided is a nonvolatile logic gate which performs logical operation using stored data determined by total resistance values of the respective nonvolatile resistor networks.

BRIEF DESCRIPTION OF THE DRAWINGS

FIG. 6 a table showing resistance values of nonvolatile resistive elements and stored data values in a nonvolatile logic gate which are represented by the resistance values, in the first exemplary embodiment of the present invention.

FIG. 8 another table showing resistance values of nonvolatile resistive elements and stored data values in a nonvolatile logic gate which are represented by the resistance values, in the first exemplary embodiment of the present invention.

FIG. 20A a top view of the nonvolatile resistor network assembly and the nonvolatile logic gate with high fault tolerance using the nonvolatile resistor network assembly, in the fifth exemplary embodiment of the present invention.

FIG. 20B another top view of the nonvolatile resistor network assembly and the nonvolatile logic gate with high fault tolerance using the nonvolatile resistor network assembly, in the fifth exemplary embodiment of the present invention.

FIG. 28 a cross-sectional view of the nonvolatile resistor network assembly and the nonvolatile logic gate with high fault tolerance using the nonvolatile resistor network assembly, in the eighth exemplary embodiment of the present invention.

FIG. 29 a top view of the nonvolatile resistor network assembly and the nonvolatile logic gate with high fault tolerance using the nonvolatile resistor network assembly, in the eighth exemplary embodiment of the present invention.

DESCRIPTION OF EMBODIMENTS

Hereinafter, exemplary embodiments of the present invention will be described on the basis of drawings.

First Exemplary Embodiment

Figure 4:
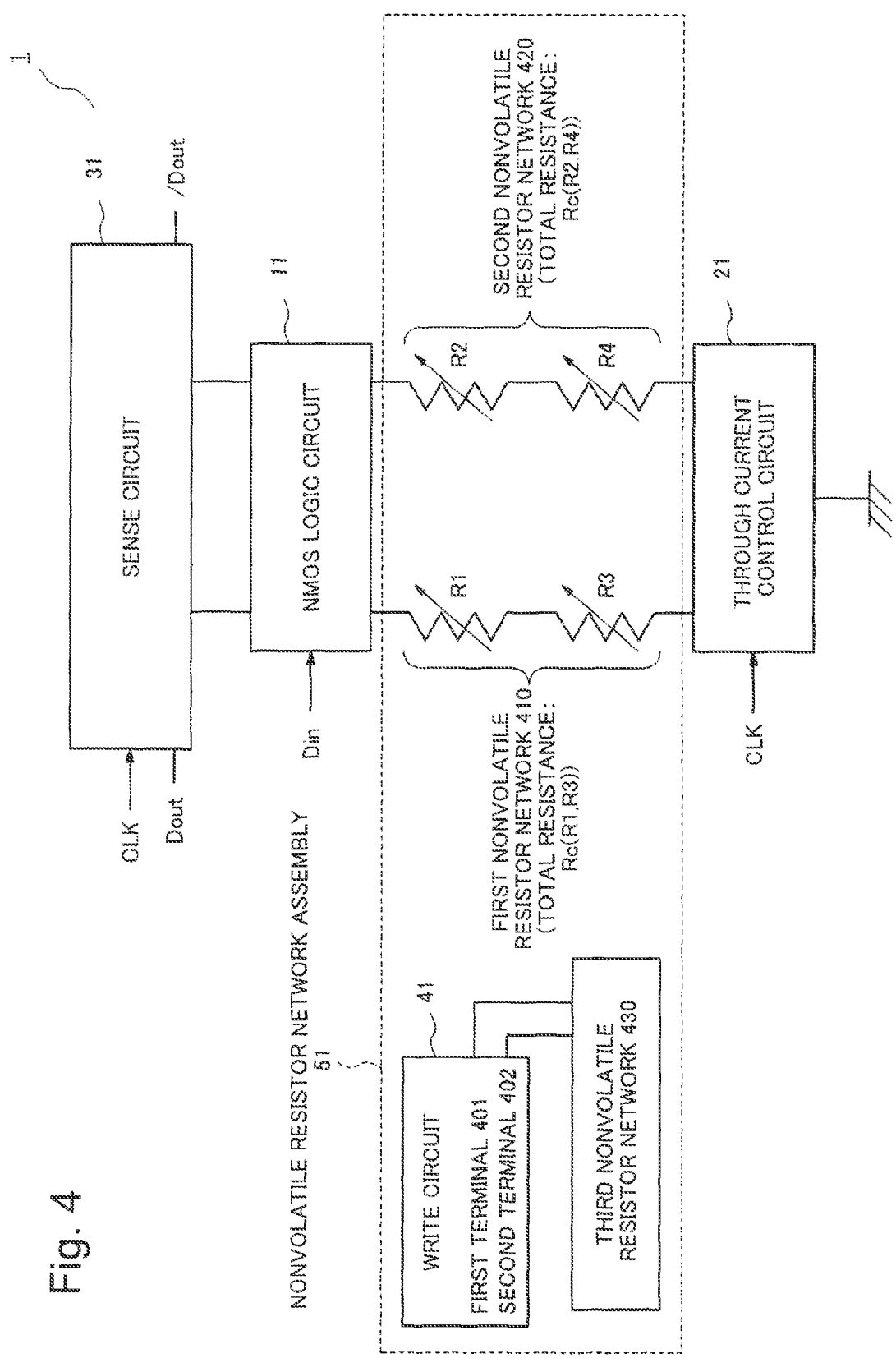
FIG. 4 a circuit diagram of a nonvolatile resistor network assembly and a nonvolatile logic gate with high fault tolerance using the nonvolatile resistor network assembly, in a first exemplary embodiment of the present invention.

FIG. 4 is a circuit diagram of a nonvolatile resistor network assembly 51 and a nonvolatile logic gate 1 with high fault tolerance using the nonvolatile resistor network assembly, both according to a first exemplary embodiment of the present invention. A first and a second nonvolatile resistor network 410 and 420 constituting the nonvolatile resistor network assembly of the present exemplary embodiment comprise two nonvolatile resistive elements R1 and R3, and two nonvolatile resistive elements R2 and R4, respectively.

The nonvolatile resistive elements R1 and R3 are connected in series with each other, and one end of the resultant network is connected to an NMOS logic circuit 11, and the other end to a through current control circuit 21. The nonvolatile resistive elements R2 and R4 are connected in series with each other, and one end of the resultant network is connected to the NMOS logic circuit 11, and the other end to the through current control circuit 21. Here, the total resistance of R1 and R3 is defined as Rc(R1,R3). The total resistance of R2 and R4 is defined as Rc(R2,R4). The total resistance is, in the present case, the resistance between the terminals of a network in which R1 and R3, or R2 and R4, are connected in series with each other. The nonvolatile logic gate 1 of the present exemplary embodiment performs logical operation by comparing the total resistances Rc(R1,R3) and Rc(R2,R4) with each other.

A write circuit 41 comprises a first terminal 401 to supply or terminate a write current and a second terminal 402 to terminate or supply the write current. When one of the first and second terminals 401 and 402 works as a terminal to supply an electric current, the other works as a terminal to terminate the current. The write circuit 41 is characterized by that it supplies a bidirectional write current to a third nonvolatile resistor network 430 which is composed of a plurality of nonvolatile resistive elements and connected between the first and second terminals 401 and 402, and it thereby writes into the plurality of nonvolatile resistive elements at one time.

Figure 5A:
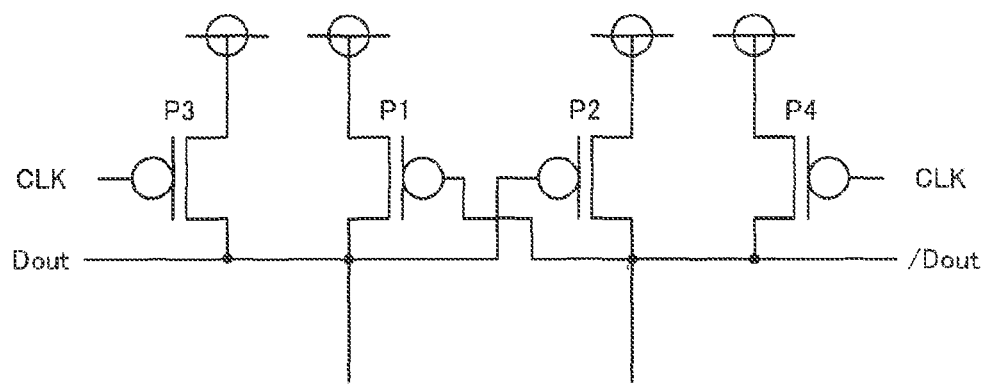
FIG. 5A a circuit diagram of a sense circuit of the nonvolatile logic gate with high fault tolerance in the first exemplary embodiment of the present invention.
Figure 5B:
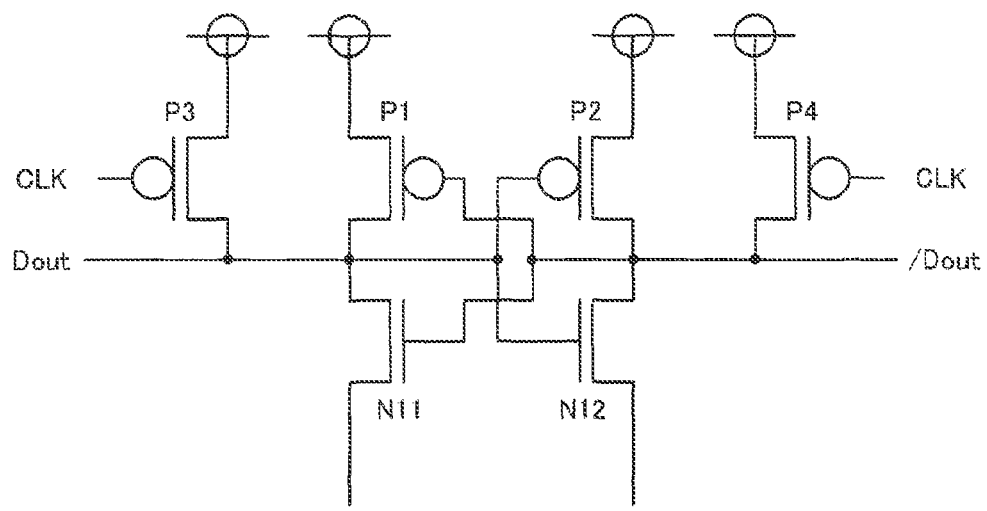
FIG. 5B a circuit diagram of another sense circuit of the nonvolatile logic gate with high fault tolerance in the first exemplary embodiment of the present invention.

A sense circuit 31 is given a clock signal and comprises output terminals Dout and /Dout. Examples of the sense circuit 31 are shown in FIGS. 5A and 5B. FIG. 5A shows the same one as the sense circuit 31' of the nonvolatile logic gate 1' in FIG. 1. Compared to FIG. 5B, two NMOS transistors N11 and N12 are added in FIG. 5A, and a latch is formed using the PMOS transistors P1 and P2 and the NMOS transistors N11 and N12.

Figure 2A:
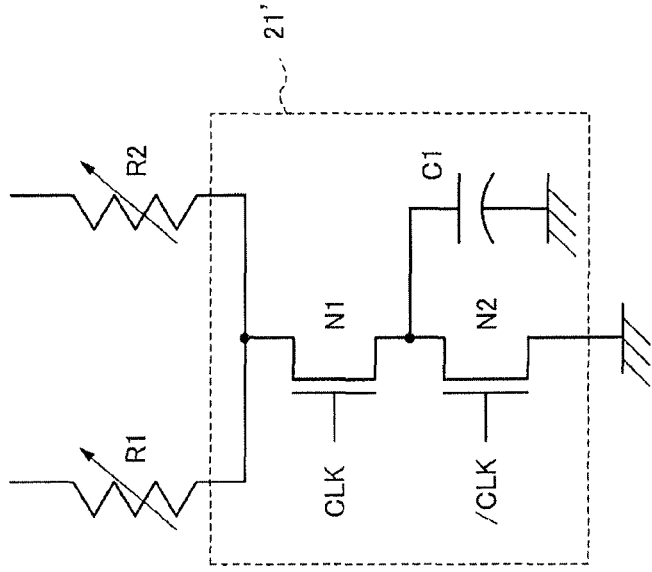
FIG. 2A a diagram showing a circuit used in the nonvolatile logic gate disclosed in Patent Document 1, in which through current flows during an operation evaluation period.
Figure 2B:
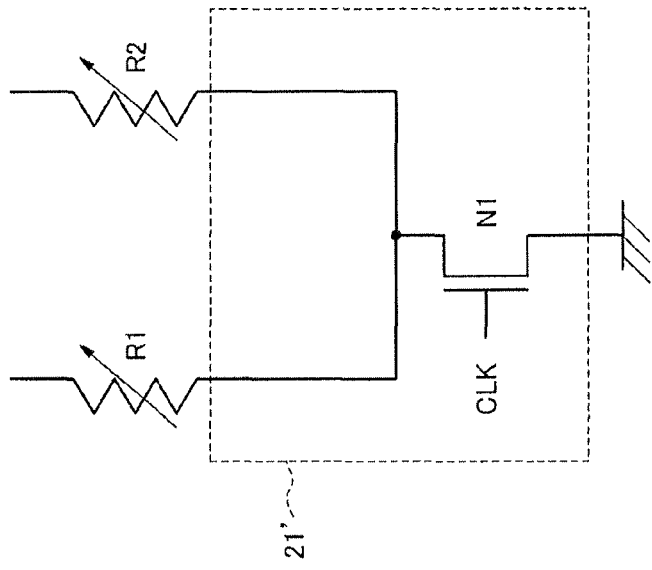
FIG. 2B a diagram showing a circuit used in the nonvolatile logic gate disclosed in Patent Document 1, in which through current does not flow during the operation evaluation period.
Figure 3:
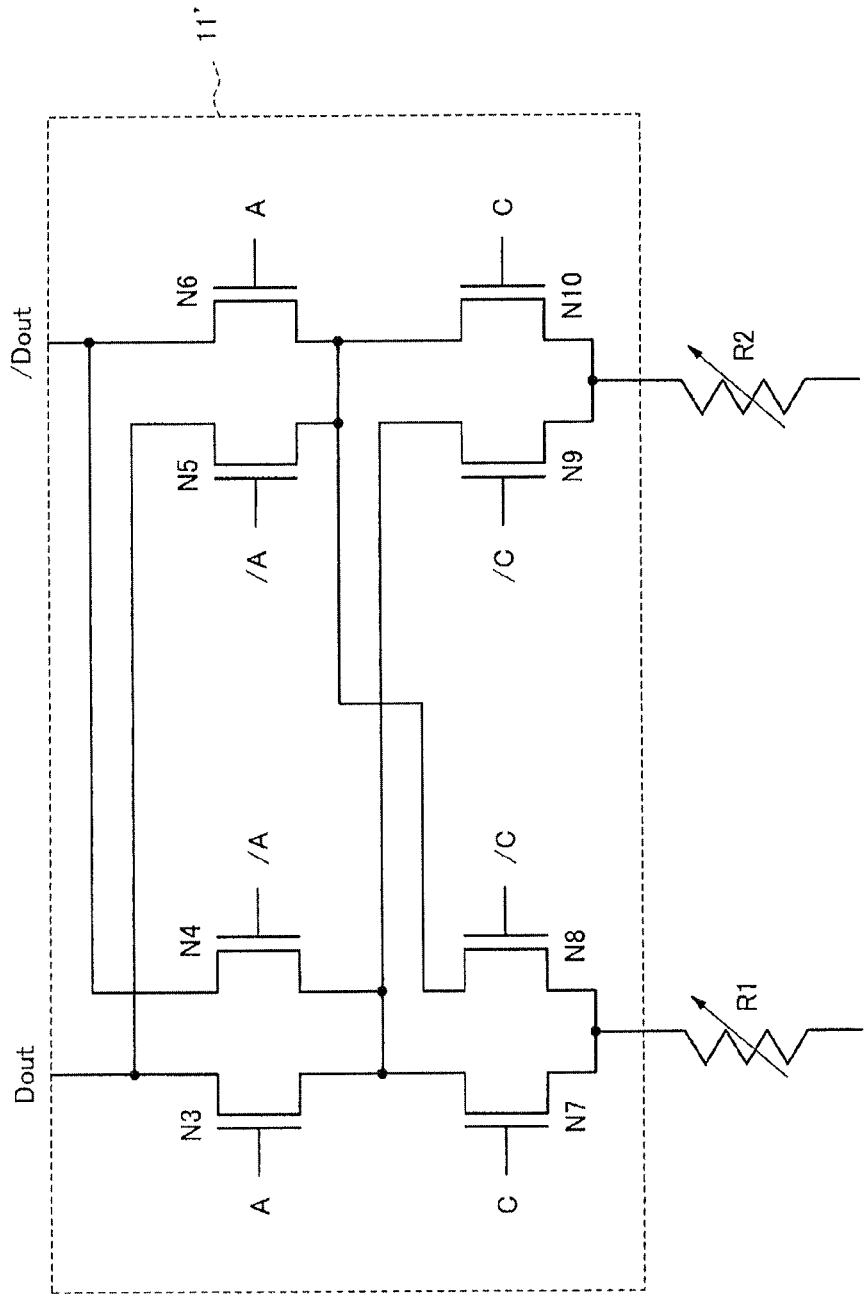
FIG. 3 a diagram showing an NMOS logic circuit used in the nonvolatile logic gate disclosed in Patent Document 1.

As the through current control circuit 21 and the NMOS logic circuit 11, the circuit shown in FIG. 2 and that in FIG. 3 may be used, respectively. Here, a description will be given taking as an example a case where the circuit shown in FIG. 5 is used as the sense circuit 31, the circuit shown in FIG. 2A as the through current control circuit 21, and the SUM circuit shown in FIG. 3 as the NMOS logic circuit 11.

FIG. 6 shows resistance values of the nonvolatile resistive elements according to the first exemplary embodiment of the present invention and stored data values in the nonvolatile logic gate which are represented by the resistance values. Identification numbers are shown in the first column of FIG. 6. In the second to fifth columns, shown are resistance values of the nonvolatile resistive elements R1, R3, R2 and R4, respectively. In the sixth and seventh columns, shown are values of the total resistance Rc(R1,R3) and Rc(R2,R4), respectively. In the eighth column, shown are values of the difference between the total resistances. In the ninth column, shown are values of stored data D in the nonvolatile logic gate corresponding to the respective states of the resistances. In the tenth column, shown are values of the minimum number of nonvolatile resistive elements storing wrong data which are estimated from the respective combinations of the nonvolatile resistive elements R1, R2, R3 and R4.

Symbols used in FIG. 6 will be described below. As resistance values of the nonvolatile resistive elements, RL represents a resistance value in the low resistance state and RH represents that in the high resistance state. The difference between the resistance values, dR, is defined by an equation 1.

$$RH-RL=dR \qquad \text{(equation 1)}$$

In the ninth column, 0 and 1 represent data 1 and data 0, respectively. Also there, X represents an indefinite value.

In the nonvolatile logic gate of the present exemplary embodiment, operation for writing data is performed such that, when the data is 0, written are the resistance values of R1, R2, R3 and R4 shown in the row of the identification number 4 into the respective nonvolatile resistive elements, and when the data is 1, written are those shown in the row of the identification number 13.

When performing logical operation, the nonvolatile logic gate of the present exemplary embodiment compares values of the total resistances Rc(R1,R3) and Rc(R2,R4), and accordingly functions as data 0 if the difference between the resistance values, Rc(R1,R3)−Rc(R2,R4), is negative, and functions as data 1 if the difference is positive. Referring to FIG. 6, it is noticed that, in the above-described way, when the number of nonvolatile resistive elements storing a wrong resistance value is zero or one, corresponding values of the data D can be used correctly in the logical operation.

For example, it is assumed that data 0 is written and accordingly resistance values of R1, R2, R3 and R4 become those of the combination shown in the row of the identification number 4 in FIG. 6 (R1 and R3 become RL, and R2 and R4 become RH), and a certain time after the writing, a soft error occurs to switch the resistance value of R4 from RH to RL (identification number 4→identification number 3). The resistance state after the occurrence of a soft error becomes that with the resistance values of R1, R2, R3 and R4 shown in the row of the identification number 3. In that case, because the difference between the total resistances is still negative even though it is smaller (−dR) than that in the case of no error (−2dR), it can be used correctly as data 0 in the logical operation.

Similarly, the logical operation is correctly performed also in the case the resistance value of R1 is switched from RL to RH (identification number 4→identification number 12, in FIG. 6), the case the resistance value of R2 is switched from RH to RL (identification number 4→identification number 2, in FIG. 6) and the case the resistance value of R3 is switched from RL to RH (identification number 4→identification number 8, in FIG. 6). That is, even if an error occurs in one resistance value among those of R1, R2, R3 and R4, the nonvolatile logic gate of the present exemplary embodiment can operate correctly.

Next, a description will be given of cases where data 1 is written. It is assumed that data 1 is written and accordingly resistance values of R1, R2, R3 and R4 become those of the combination shown in the row of the identification number 13 in FIG. 6 (R1 and R3 become RH, and R2 and R4 become RL), and a certain time after the writing, a soft error occurs to switch the resistance value of R4 from RL to RH (identification number 13→identification number 14). The resistance state after the occurrence of a soft error becomes that with the resistance values of R1, R2, R3 and R4 shown in the row of the identification number 14. In that case, because the difference between the total resistances is still positive even though it is smaller (dR) than that in the case of no error (2dR), it can be used correctly as data 1 in the logical operation.

Similarly, the logical operation is correctly performed also in the case the resistance value of R1 is switched from RH to RL (identification number 13→identification number 5, in FIG. 6), the case the resistance value of R2 is switched from RL to RH (identification number 13→identification number 9, in FIG. 6) and the case the resistance value of R3 is switched from RH to RL (identification number 13→identification number 15, in FIG. 6). That is, even if an error occurs in one resistance value among those of R1, R2, R3 and R4, the nonvolatile logic gate of the present exemplary embodiment can operate correctly.

However, when the number of errors in the resistance values is equal to or larger than two, determination of which one of the two data states has been written is impossible, and accordingly incorrect operation occurs. Such a situation will be described below using a specific example, with reference to FIG. 6. For example, it is assumed that data 0 is written and accordingly resistance values of R1, R2, R3 and R4 become those of the combination shown in the row of the identification number 4, and a certain time after the writing, a soft error occurs to switch both of the resistance values of R2 and R4 from RH to RL. The resistance state after the occurrence of a soft error becomes that with the resistance values of R1, R2, R3 and R4 shown in the row of the identification number 1. When logical operation is performed in that case, because the difference between the total resistances becomes zero, the data becomes indefinite and thus unable to be determined whether being 0 or 1, and accordingly the operation becomes incorrect. However, because the probability of occurrence of more than one error is substantially lower than that of only one error, such incorrect operation scarcely occurs.

As has been described above, the nonvolatile resistor network assembly of the present exemplary embodiment and the nonvolatile logic gate using the nonvolatile resistor network assembly can substantially reduce the probability of incorrect operation in a case an error occurs in data stored in the memory elements.

Figure 7:
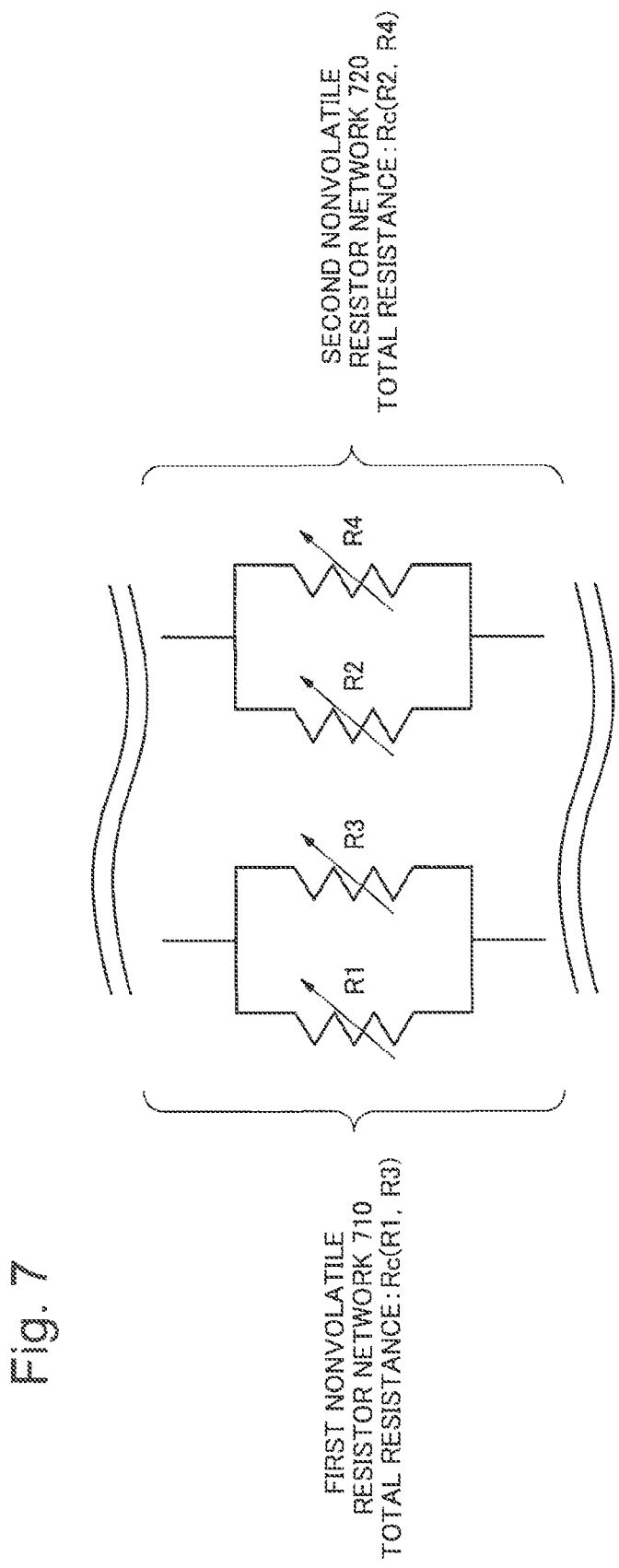
FIG. 7 a diagram showing a first and a second nonvolatile resistor network constituting a nonvolatile resistor network assembly in the first exemplary embodiment of the present invention.

Next, FIG. 7 shows a case where, in each of the first and second nonvolatile resistor networks, the nonvolatile resistive elements constituting the network are connected in parallel with each other. That is, a first nonvolatile resistor network 710 is composed of a parallel connection of R1 and R3, and a second nonvolatile resistor network 720 is composed of a parallel connection of R2 and R4.

For the case shown in FIG. 7 where, in each of the first and second nonvolatile resistor networks, the nonvolatile resistive elements constituting the network are connected in parallel with each other, FIG. 8 shows resistance values of the nonvolatile resistive elements and stored data values in the nonvolatile logic gate which are represented by the resistance values. The configuration of FIG. 8 is the same as that of FIG. 6 (for the case where, in each of the first and second nonvolatile resistor networks, the nonvolatile resistive elements constituting the network are connected in series with each other). That is, identification numbers are shown in the first column. In the second to fifth columns, shown are resistance values of the nonvolatile resistive elements R1, R3, R2 and R4, respectively. In the sixth and seventh columns, shown are values of the total resistance Rc(R1,R3) and Rc(R2,R4), respectively. In the eighth column, shown are values of the difference between the total resistances. In the ninth column, shown are values of stored data D in the nonvolatile logic gate corresponding to the respective states of the resistances. In the tenth column, shown are values of the minimum number of nonvolatile resistive elements storing wrong data which are estimated from the respective combinations of the nonvolatile resistive elements R1, R2, R3 and R4.

Symbols used in FIG. 8 will be described below. As resistance values of the nonvolatile resistive elements, RL represents a resistance value in the low resistance state and RH represents that in the high resistance state. The parallel resistance value of RH and RL is represented as RL/(1+RL/RH) or RH/(1+RH/RL). Because RH>RL, RL/2<RL/(1+RL/RH) and RH/2>RH/(1+RH/RL) hold. In the ninth column, 0 and 1 represent data 1 and data 0, respectively. Also there, X represents an indefinite value.

In the nonvolatile logic gate of the present exemplary embodiment, operation for writing data is performed such that, when the data is 0, written are the resistance values of R1, R2, R3 and R4 shown in the row of the identification number 4 into the respective nonvolatile resistive elements, and when the data is 1, written are those shown in the row of the identification number 13.

When performing logical operation, the nonvolatile logic gate of the present exemplary embodiment compares values of the total resistances Rc(R1,R3) and Rc(R2,R4), and accordingly functions as data 0 if the difference between the resistance values, Rc(R1,R3)−Rc(R2,R4), is negative (<0), and functions as data 1 if the difference is positive (>0). Referring to FIG. 8, it is noticed that, in the above-described way, when the number of nonvolatile resistive elements storing a wrong resistance value is zero or one, corresponding values of the data D can be used correctly in the logical operation.

For example, it is assumed that data 0 is written and accordingly resistance values of R1, R2, R3 and R4 become those of the combination shown in the row of the identification number 4, and a certain time after the writing, a soft error occurs to switch the resistance value of R4 from RH to RL (identification number 4→identification number 3, in FIG. 8). The resistance state after the occurrence of a soft error becomes that with the resistance values of R1, R2, R3 and R4 shown in the row of the identification number 3. In that case, because the difference between the total resistances is still negative even with the error, similarly to the case of no error, it can be used correctly as data 0 in the logical operation.

Similarly, the logical operation is correctly performed also in the case the resistance value of R1 is switched from RL to RH (identification number 4→identification number 12, in FIG. 8), the case the resistance value of R2 is switched from RH to RL (identification number 4→identification number 2, in FIG. 8) and the case the resistance value of R3 is switched from RL to RH (identification number 4→identification number 8, in FIG. 8). That is, even if an error occurs in one resistance value among those of R1, R2, R3 and R4, the nonvolatile logic gate of the present exemplary embodiment can operate correctly.

Next, a description will be given of cases where data 1 is written. It is assumed that data 1 is written and accordingly resistance values of R1, R2, R3 and R4 become those of the combination shown in the row of the identification number 13, and a certain time after the writing, a soft error occurs to switch the resistance value of R4 from RL to RH (identification number 13→identification number 14). The resistance state after the occurrence of a soft error becomes that with the resistance values of R1, R2, R3 and R4 shown in the row of the identification number 14. In that case, because the difference between the total resistances is still positive even with the error, similarly to the case of no error, it can be used correctly as data 1 in the logical operation.

Similarly, the logical operation is correctly performed also in the case the resistance value of R1 is switched from RH to RL (identification number 13→identification number 5, in FIG. 8), the case the resistance value of R2 is switched from RL to RH (identification number 13→identification number 9, in FIG. 8) and the case the resistance value of R3 is switched from RH to RL (identification number 13→identification number 15, in FIG. 8). That is, even if an error occurs in one resistance value among those of R1, R2, R3 and R4, the nonvolatile logic gate of the present exemplary embodiment can operate correctly.

However, when the number of errors in the resistance values is equal to or larger than two, determination of which one of the two data states has been written is impossible, and accordingly incorrect operation occurs. Such a situation will be described below using a specific example, with reference to FIG. 8. For example, it is assumed that data 0 is written and accordingly resistance values of R1, R2, R3 and R4 become those of the combination shown in the row of the identification number 4, and a certain time after the writing, a soft error occurs to switch the resistance values of R2 and R4 from RH to RL. The resistance state after the occurrence of a soft error becomes that with the resistance values of R1, R2, R3 and R4 shown in the row of the identification number 1. When logical operation is performed in such a case, because the difference between the total resistances becomes zero, the data becomes indefinite and thus unable to be determined whether being 0 or 1, and accordingly the operation becomes incorrect. However, because the probability of occurrence of more than one error is substantially lower than that of only one error, such incorrect operation scarcely occurs.

As has been described above, the nonvolatile resistor network assembly of the present exemplary embodiment and the nonvolatile logic gate using the nonvolatile resistor network assembly can substantially reduce the probability of incorrect operation in a case an error occurs in data stored in the memory elements.

Second Exemplary Embodiment

Figure 9:
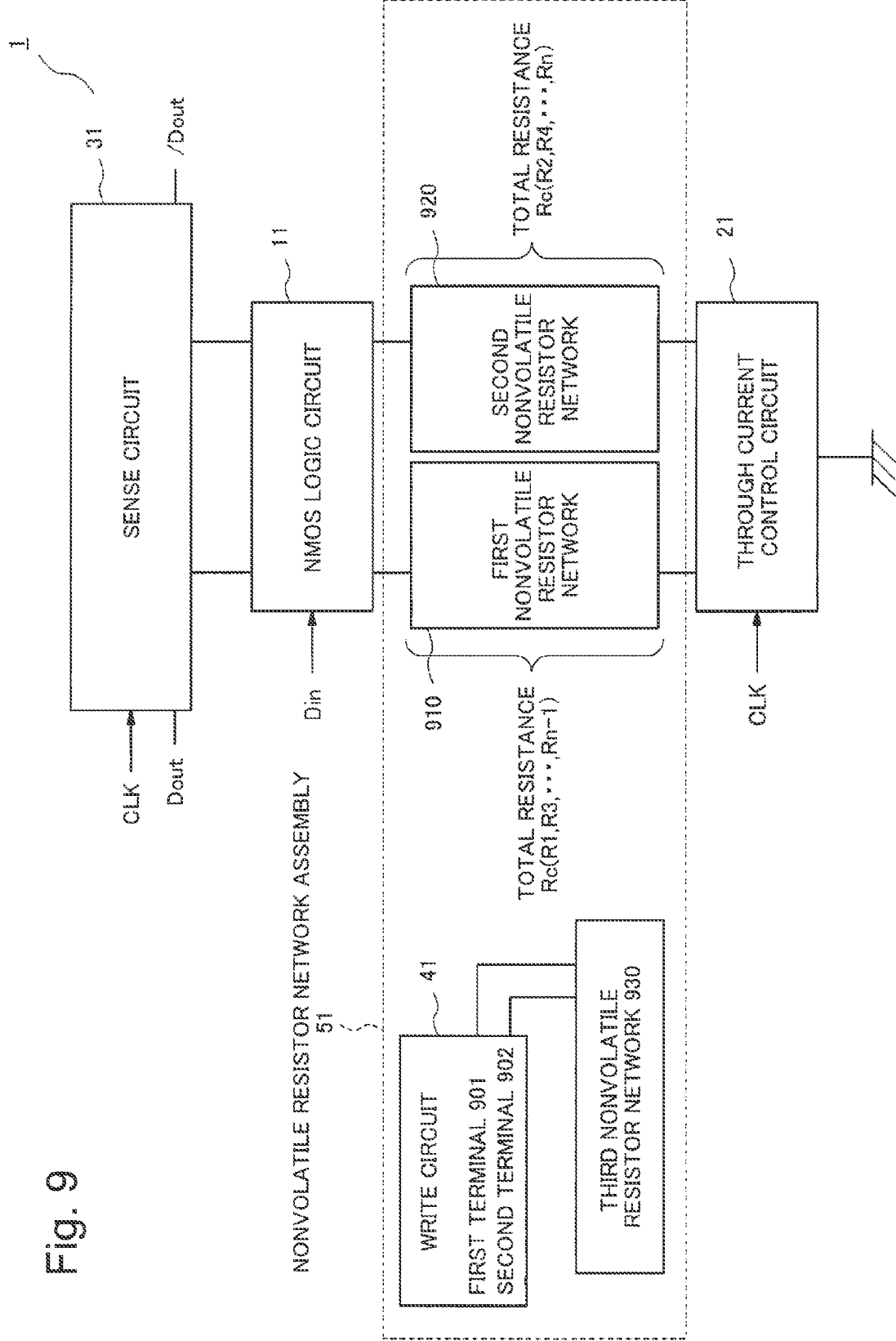
FIG. 9 a circuit diagram of a nonvolatile resistor network assembly and a nonvolatile logic gate with high fault tolerance using the nonvolatile resistor network assembly, in a second exemplary embodiment of the present invention.

FIG. 9 is a circuit diagram of a nonvolatile resistor network assembly 51 and a nonvolatile logic gate 1 with high fault tolerance using the nonvolatile resistor network assembly, both according to a second exemplary embodiment of the present invention. The nonvolatile resistor network assembly 51 of the present exemplary embodiment comprises a first and a second nonvolatile resistor network 910 and 920 each consisting of n/2 number of nonvolatile resistive elements. Here, n is assumed to be an even number larger than 4.

A write circuit 41 comprises a first terminal 901 to supply or terminate a write current and a second terminal 902 to terminate or supply the write current. When one of the first and second terminals 901 and 902 works as a terminal to supply an electric current, the other works as a terminal to terminate the current. The write circuit 41 is characterized by that it supplies a bidirectional write current to a third nonvolatile resistor network 430 which is composed of a plurality of nonvolatile resistive elements and connected between the first and second terminals 401 and 402, and it thereby writes into a plurality of nonvolatile resistive elements at one time.

As a sense circuit 31, a NMOS logic circuit 11 and a through current control circuit 21, the same ones as those in the first exemplary embodiment may be used, respectively.

Figure 10:
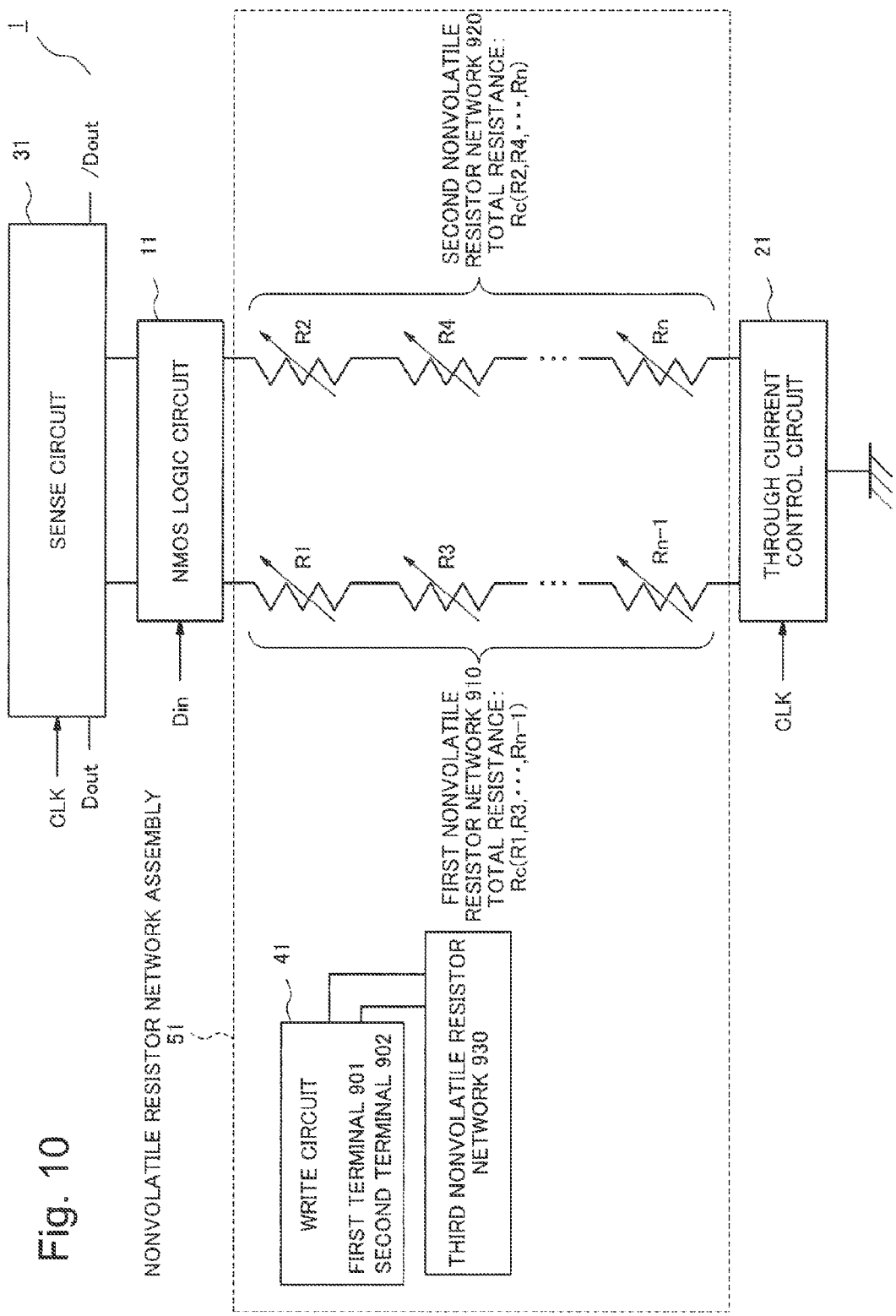
FIG. 10 a specific circuit diagram of a nonvolatile resistor network assembly and a nonvolatile logic gate with high fault tolerance using the nonvolatile resistor network assembly, in the second exemplary embodiment of the present invention.
Figure 11A:
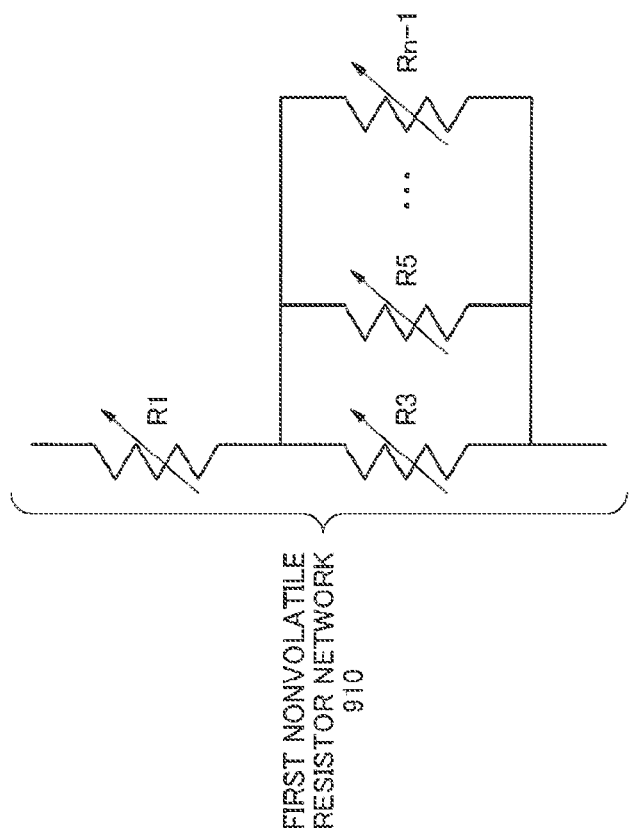
FIG. 11A a configuration diagram of a resistor combination in a nonvolatile resistor network assembly in the second exemplary embodiment of the present invention.
Figure 11B:
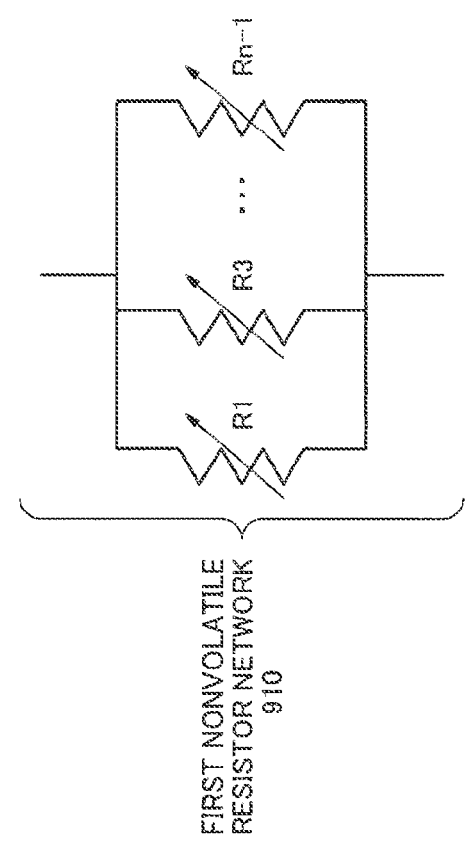
FIG. 11B a configuration diagram of another resistor combination in a nonvolatile resistor network assembly in the second exemplary embodiment of the present invention.

As an example, FIG. 10 shows a case in which the nonvolatile resistor networks of the present exemplary embodiment are each formed as a series connection. Here, the nonvolatile resistor networks may be formed as a parallel or series-parallel connection, as shown in FIG. 11A or 11B, respectively.

In FIG. 10, nonvolatile resistive elements R1, R3, ... and Rn−1 are connected in series together, and one end of the resultant network is connected to the NMOS logic circuit 11, and the other end to the through current control circuit 21. Nonvolatile resistive elements R2, R4, ... and Rn are connected in series together, and one end of the resultant network is connected to the NMOS logic circuit 11, and the other end to the through current control circuit 21. Here, the total resistance of R1, R3, ... and Rn−1 is defined as Rc(R1, R3, ..., Rn−1). Similarly, the total resistance of R2, R4, ... and Rn is defined as Rc(R2, R4, ..., Rn). In the nonvolatile logic gate of the present exemplary embodiment, the same resistance data is written into all of R1, R3, ... and Rn−1. Into all of R1, R3, ... and Rn−1, written is resistance data complementary to that written into R2, R4, ... and Rn. The nonvolatile logic gate performs logical operation by comparing values of the total resistances Rc(R1, R3, ..., Rn−1) and Rc(R2, R4, ..., Rn) with each other.

As a result of the use of a plurality of nonvolatile resistive elements, the nonvolatile logic gate of the present exemplary embodiment can correctly operate even if more than one resistance data errors occur owing to a soft error or the like.

In the nonvolatile resistor network assembly of the present exemplary embodiment, a write circuit 41 in each of exemplary embodiments 3 to 8 to be described later may be employed, and accordingly writing into the a plurality of nonvolatile resistive elements can be performed at one time by supplying a write current passing serially through the plurality of nonvolatile resistive elements. As a result, no additional write circuit is required, and accordingly the circuit area can be suppressed to be small. Simultaneously, the power consumption can be suppressed to be low. Additionally, because the above-described nonvolatile resistive elements are laid onto a CMOS circuit formed in a transistor layer, increase in the area can be suppressed.

As has been described above, the nonvolatile resistor network assembly and the nonvolatile logic gate using it, of the present exemplary embodiment, provide a nonvolatile logic gate with increased fault tolerance which can perform logical operation correctly even if an error occurs in memory data.

Third Exemplary Embodiment

Figure 12:
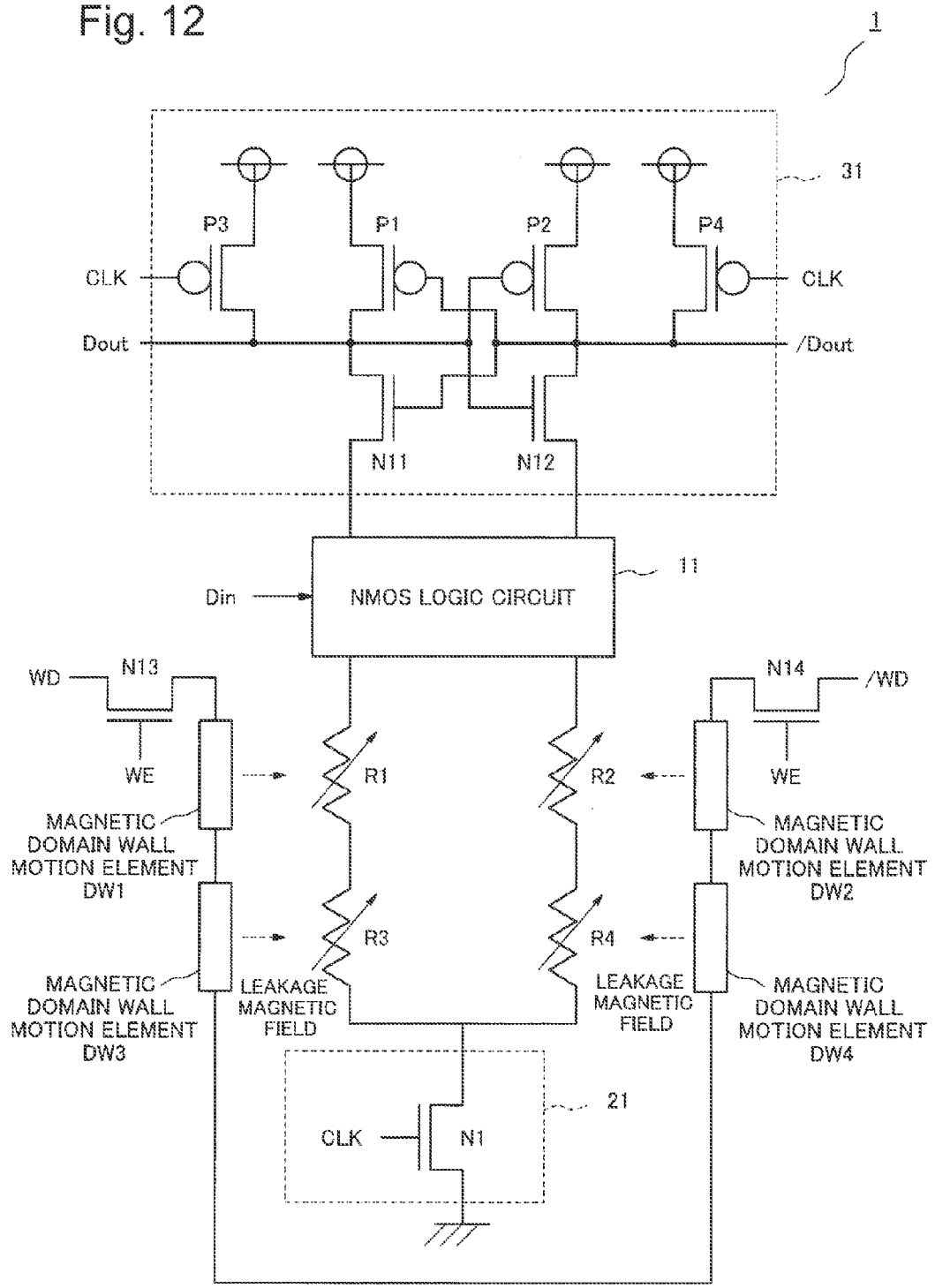
FIG. 12 a circuit diagram of a nonvolatile resistor network assembly and a nonvolatile logic gate with high fault tolerance using the nonvolatile resistor network assembly, in a third exemplary embodiment of the present invention.

FIG. 12 is a circuit diagram of a nonvolatile resistor network assembly and a nonvolatile logic gate 1 with high fault tolerance using the nonvolatile resistor network assembly, which are both according to a third exemplary embodiment of the present invention. In the present exemplary embodiment, a magnetic domain wall motion element is used as a specific means for writing into nonvolatile resistive elements. Further, sense elements are used as nonvolatile resistive elements R1, R2, R3 and R4.

More specifically, the present exemplary embodiment comprises NMOS transistors N13 and N14, magnetic domain wall motion elements DW1, DW2, DW3 and DW4, complementary data input terminals WD and /WD, and a write enable signal WE. The magnetic domain wall motion elements each exert influence on the resistance of a corresponding one of the sense elements through its leakage magnetic field.

A description will be given below of connection relationships in the write part of the present exemplary embodiment. The magnetic domain wall motion elements DW1, DW2, DW3 and DW4 are sequentially connected in series, and one end of the resultant network is connected to the NMOS transistor N13, and the other end to the NMOS transistor N14. The NMOS transistor N13 is connected to the write data terminal WD, and the NMOS transistor N14 to the write data terminal /WD. The gates of the NMOS transistors N13 and N14 are each connected to the write enable signal WE.

As a sense circuit 31 and a through current control circuit 21, the respective corresponding circuits in FIGS. 5B and 2A are used. As an NMOS logic circuit 11, the circuit in FIG. 3 may be used.

Figure 13:
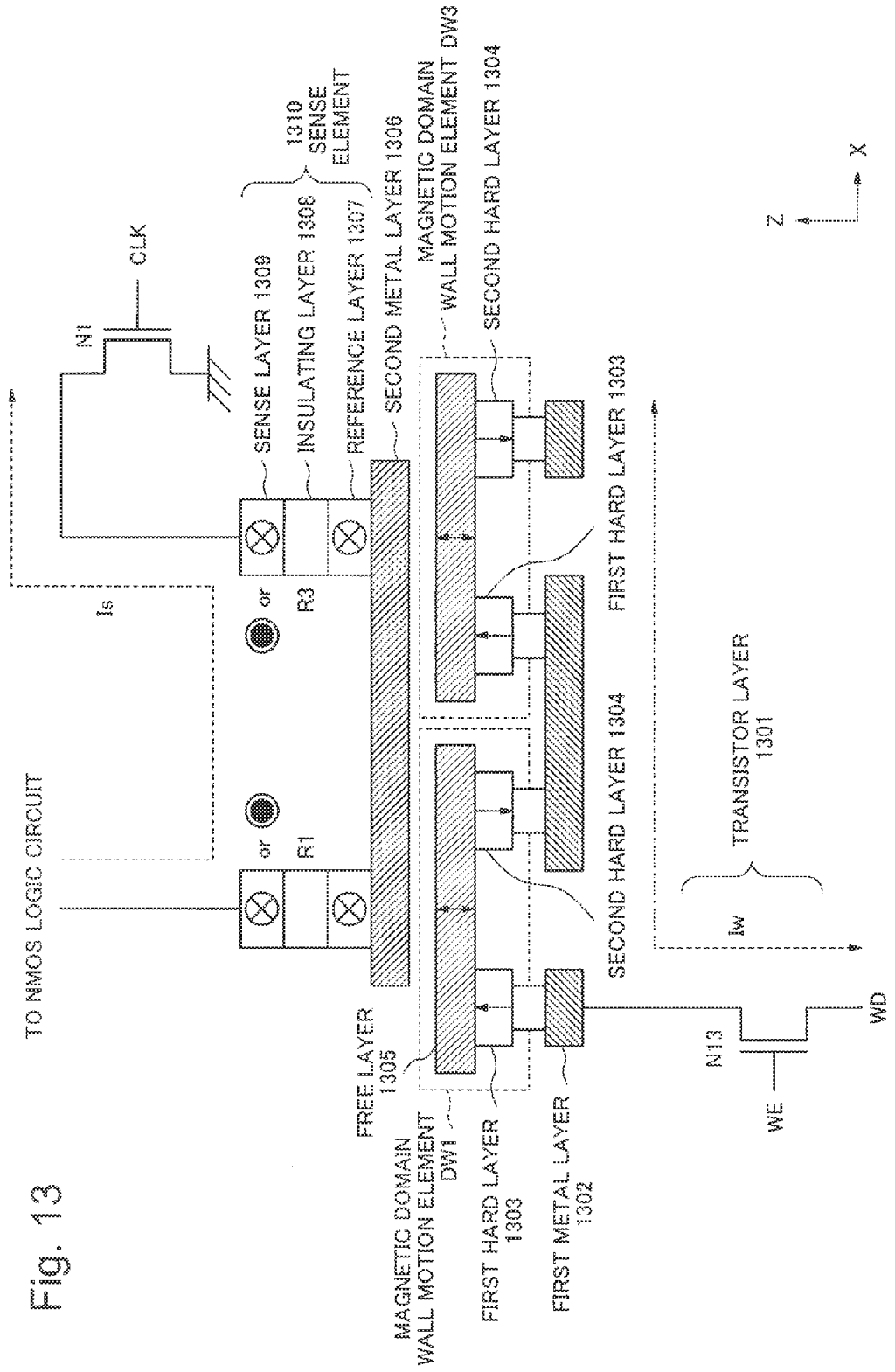
FIG. 13 a cross-sectional view of the nonvolatile resistor network assembly and the nonvolatile logic gate with high fault tolerance using the nonvolatile resistor network assembly, in the third exemplary embodiment of the present invention.

FIG. 13 is a cross-sectional view of the vicinity of the nonvolatile resistive elements in the nonvolatile logic gate of the present exemplary embodiment, where the NMOS transistor N13, the magnetic domain wall motion elements DW1 and DW3, the nonvolatile resistive elements R1 and R3, and an NMOS transistor N1 are illustrated. The longitudinal direction of the magnetic domain wall motion elements lying parallel to the layer surfaces is defined as X, and the direction perpendicular to the layer surfaces as Z.

Figure 14A:
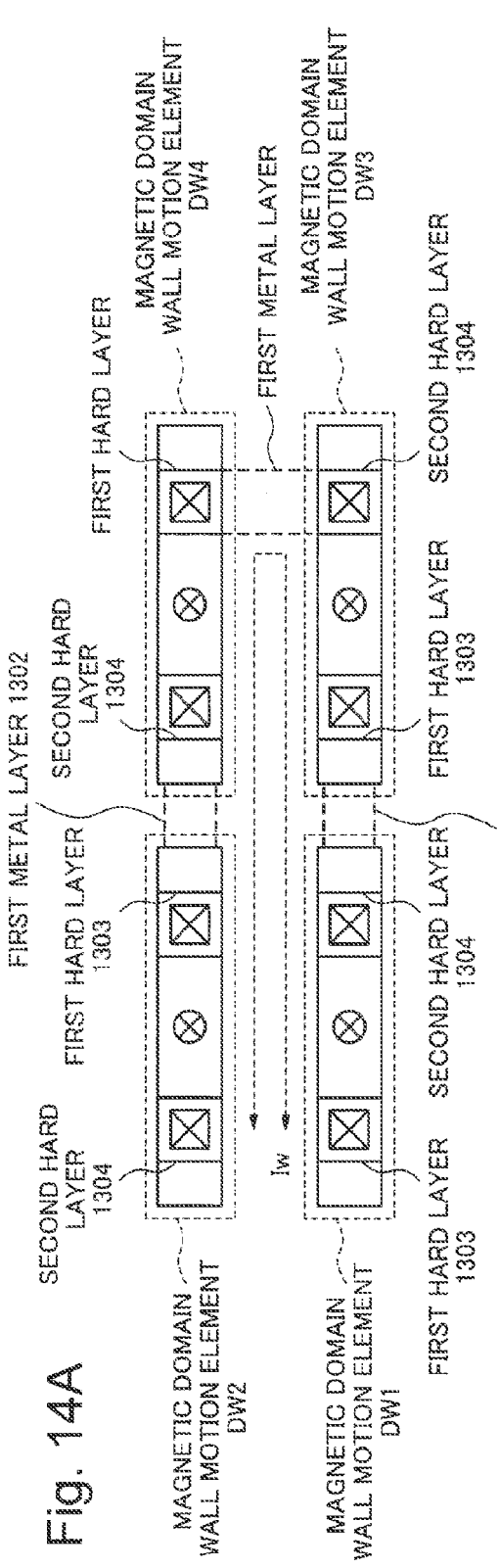
FIG. 14A a top view of the nonvolatile resistor network assembly and the nonvolatile logic gate with high fault tolerance using the nonvolatile resistor network assembly, in the third exemplary embodiment of the present invention.
Figure 14B:
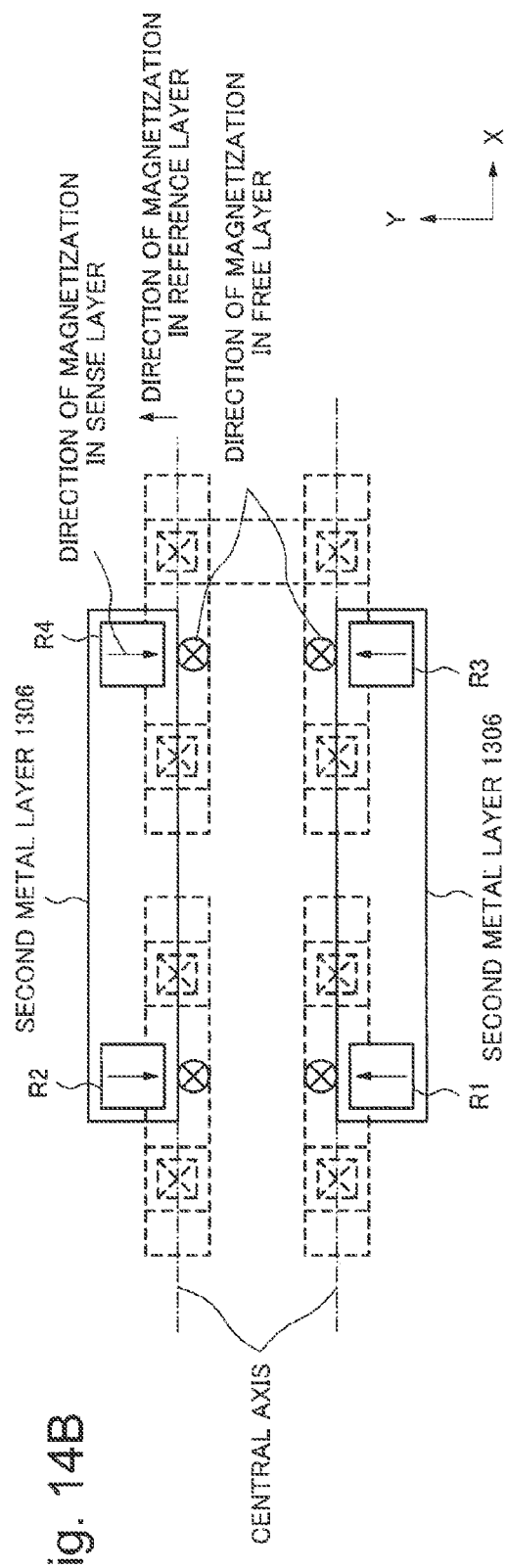
FIG. 14B another top view of the nonvolatile resistor network assembly and the nonvolatile logic gate with high fault tolerance using the nonvolatile resistor network assembly, in the third exemplary embodiment of the present invention.

FIGS. 14A and 14B are plan views of the nonvolatile logic gate of the present exemplary embodiment. The longitudinal direction of the magnetic domain wall motion elements lying parallel to the layer surfaces is defined as X, and its perpendicular direction also lying parallel to the layer surfaces as Y. FIG. 14A shows an outline of a free layer and layers beneath it. FIG. 14B shows an outline of a sense layer and layers beneath it.

The magnetic domain wall motion elements DW1 and DW3 each comprise a free layer 1305, a first hard layer 1303 and a second hard layer 1304. For example, magnetic thin films having perpendicular magnetic anisotropy are used for the free layer and the first and second hard layers. The sense elements each comprise a sense layer, an insulating layer and a reference layer. For example, magnetic thin films having in-plane magnetic anisotropy are used for the sense layer and the reference layer.

With reference to FIG. 13, a description will be given below of the cross-sectional structure of the nonvolatile logic gate of the present exemplary embodiment. The cross-sectional structure comprises, in order of closeness to the substrate, a transistor layer 1301 constituting a CMOS circuit, a first metal layer 1302, the first hard layer 1303, the second hard layer 1304, the free layer 1305, a second metal layer 1306, the reference layer 1307, the insulating layer 1308 and the sense layer 1309. The sense element 1310 may be formed by stacking, in order of closeness to the substrate, the sense layer, the insulating layer and the reference layer, inversely to the order in FIG. 13. The first and second hard layers may be laid onto the free layer. The direction of magnetization in the first hard layer 1303 and that in the second hard layer 1304 are fixed to be opposite to each other, as shown by arrows in FIG. 13. By setting the write enable signal WE at High, a write current Iw is supplied to the free layer. Through a spin torque effect, the magnetization of the free layer can be altered between upward and downward in Z direction depending on the direction of spin-polarized current as the write current Iw. The sense layer 1309 of the sense element 1310 is located above the free layer 1305, and can sense a leakage magnetic field from the free layer with high sensitivity. The sense element may be arranged underneath the free layer.

In the nonvolatile logic gate of the present exemplary embodiment, the write current Iw flows, via the NMOS transistor N13, into and through the free layer connected in series with the NMOS transistor N13. The direction of magnetization in the free layer can be directed in Z direction or −Z direction depending on the direction of the write current. A read current Is flows from the sense circuit and the NMOS logic circuit 11, through the two sense elements R1 and R3 and the NMOS transistor N1, to the ground.

With reference to FIGS. 14A and 14B, a description will be given below of the lateral structure of the nonvolatile logic gate of the present exemplary embodiment. The magnetic domain wall motion elements DW1, DW2, DW3 and DW4 are electrically connected together in series. Affected by a leakage magnetic field from the free layer 1305, the magnetization in the sense layer of each of the sense elements R1, R2, R3 and R4, which are arranged slightly deviating from the central axis of the corresponding free layer 1305, is directed in +Y or −Y direction. When the direction of magnetization in the reference layer 1307 of each of the sense elements is set to be +Y direction and the magnetization in the free layer of each of the magnetic domain wall motion elements is directed in −Z direction, the sense elements R1 and R3 are in the low resistance state, and the sense elements R2 and R4 are in the high resistance state. When the direction of the write current is reversed, the direction of magnetization in each of the free layers is reversed, and accordingly the resistance state of each of the sense elements is switched to the opposite state.

Figure 1:
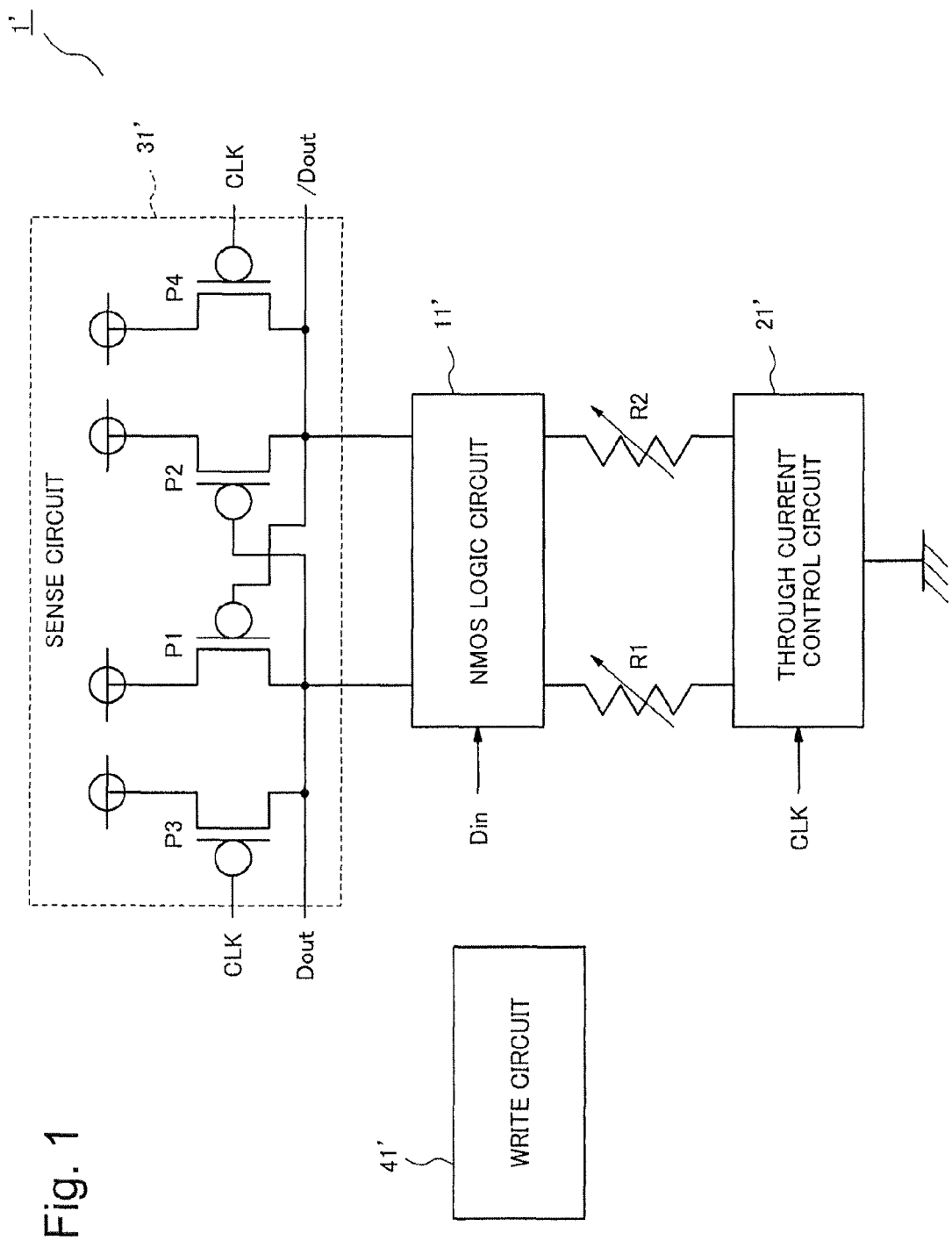
FIG. 1 a diagram showing a circuit configuration of a nonvolatile logic gate disclosed in Patent Document 1.

Compared to the nonvolatile logic gate in FIG. 1, although the nonvolatile logic gate of the present exemplary embodiment requires addition of two nonvolatile resistive elements in order to increase fault tolerance, it is characterized by that writing into a plurality of nonvolatile resistive elements is performed at one time by supplying a write current passing serially through the plurality of nonvolatile resistive elements, and as a result, no additional write circuit is required, and accordingly the circuit area can be suppressed to be small. Simultaneously, the power consumption can be suppressed to be low. Additionally, because the above-described nonvolatile resistive elements are laid onto the CMOS circuit formed in the above-mentioned transistor layer, increase in the circuit area can be suppressed.

As has been described above, the nonvolatile resistor network assembly and the nonvolatile logic gate using it, of the present exemplary embodiment, provide a nonvolatile logic gate with increased fault tolerance, while suppressing area increase and power consumption of the circuit.

Fourth Exemplary Embodiment

Figure 15:
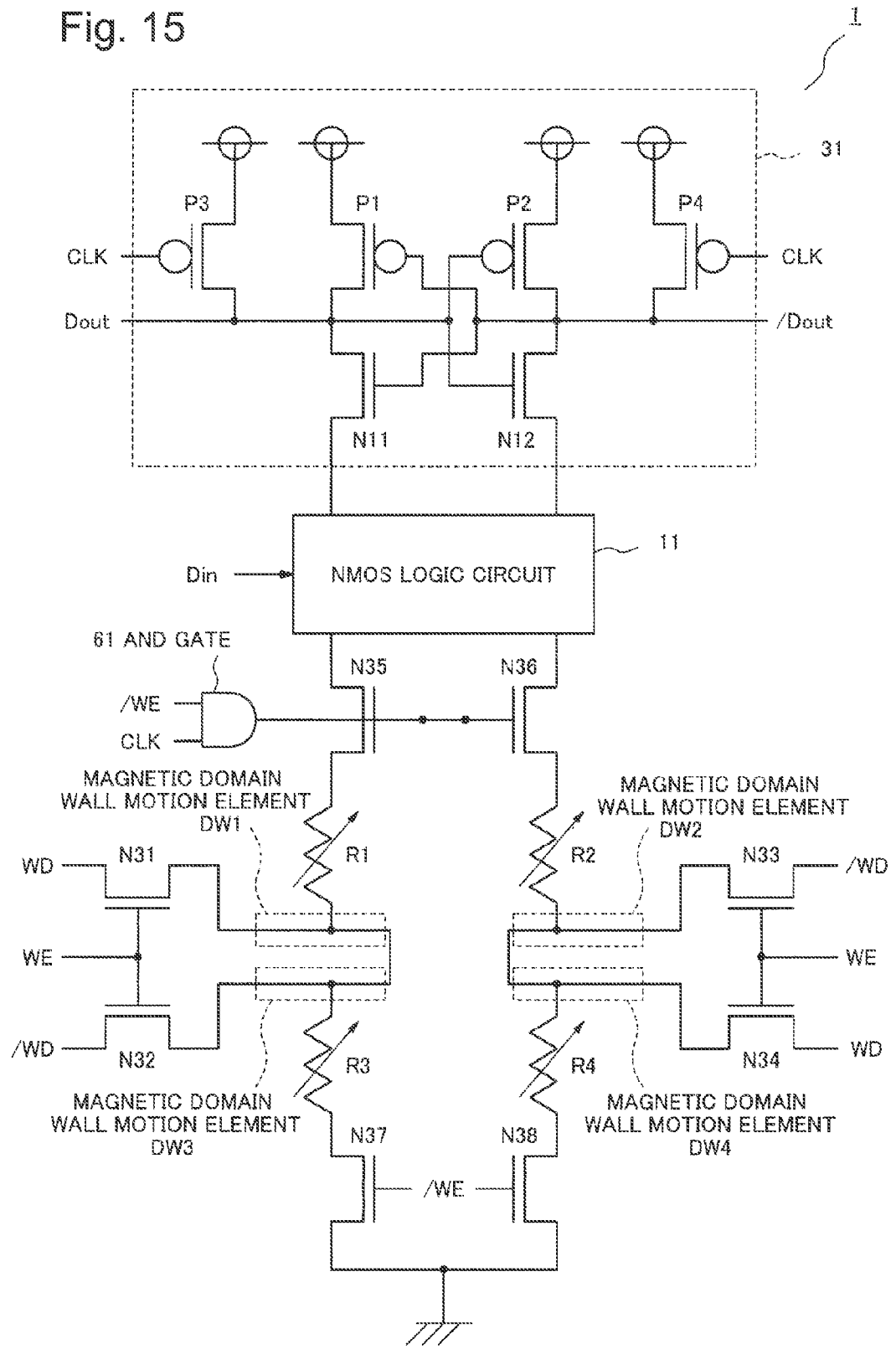
FIG. 15 a circuit diagram of a nonvolatile resistor network assembly and a nonvolatile logic gate with high fault tolerance using the nonvolatile resistor network assembly, in a fourth exemplary embodiment of the present invention.

FIG. 15 is a circuit diagram of a nonvolatile resistor network assembly and a nonvolatile logic gate 1 with high fault tolerance using the nonvolatile resistor network assembly, which are both according to a fourth exemplary embodiment of the present invention. The nonvolatile logic gate of the present exemplary embodiment is the same as that of the third exemplary embodiment (FIG. 12) in that it uses magnetic domain wall motion elements as a specific means for writing into nonvolatile resistive elements, but is different from the third exemplary embodiment in that the nonvolatile resistive elements and the magnetic domain wall motion elements are integrated together.

More specifically, it comprises NMOS transistors N31, N32, N33, N34, N35, N36, N37 and N38, an AND gate 61, complementary data input signals WD and /WD, and complementary write enable signals WE and /WE.

A description will be given below of connection relationships in the write part of the nonvolatile logic gate of the present exemplary embodiment. One end of a nonvolatile resistive element R1 is connected to the NMOS transistor N31 via a magnetic domain wall motion element DW1, to the NMOS transistor N32 via magnetic domain wall motion elements DW1 and DW3, and to a nonvolatile resistive element R3 via the magnetic domain wall motion elements DW1 and DW3, and the other end is connected to the NMOS transistor N35.

One end of the nonvolatile resistive element R3 is connected to the NMOS transistor N32 via the magnetic domain wall motion element DW3, to the NMOS transistor N31 via the magnetic domain wall motion elements DW3 and DW1, and to the nonvolatile resistive element R1 via the magnetic domain wall motion elements DW3 and DW1, and the other end is connected to the NMOS transistor N37.

One end of a nonvolatile resistive element R2 is connected to the NMOS transistor N33 via a magnetic domain wall motion element DW2, to the NMOS transistor N34 via magnetic domain wall motion elements DW2 and DW4, and to a nonvolatile resistive element R4 via the magnetic domain wall motion elements DW2 and DW4, and the other end is connected to the NMOS transistor N36.

One end of the nonvolatile resistive element R4 is connected to the NMOS transistor N33 via the magnetic domain wall motion element DW4, to the NMOS transistor N34 via magnetic domain wall motion elements DW4 and DW2, and to the nonvolatile resistive element R2 via the magnetic domain wall motion elements DW4 and DW2, and the other end is connected to the NMOS transistor N38.

One end of the NMOS transistor N31 is connected to the write data signal WD, the other end to the NMOS transistor N32 via the magnetic domain wall motion elements DW1 and DW3, and the gate to the write enable signal WE.

One end of the NMOS transistor N32 is connected to the write data signal /WD, the other end to the NMOS transistor N31 via the magnetic domain wall motion elements DW3 and DW1, and the gate to the write enable signal WE.

One end of the NMOS transistor N33 is connected to the write data signal /WD, the other end to the NMOS transistor N33 via the magnetic domain wall motion elements DW2 and DW4, and the gate to the write enable signal WE.

One end of the NMOS transistor N34 is connected to the write data signal WD, the other end to the NMOS transistor N34 via the magnetic domain wall motion elements DW4 and DW2, and the gate to the write enable signal WE.

The drain of the NMOS transistor N35 is connected to the NMOS logic circuit 11, the source to the nonvolatile resistive element R1, and the gate to the output of an AND gate 61 between the write disable signal /WE and a clock signal CLK. The drain of the NMOS transistor N36 is connected to the NMOS logic circuit 11, the source to the nonvolatile resistive element R2, and the gate to the output of the AND gate 61 between the write disable signal /WE and the clock signal CLK.

The drain of the NMOS transistor N37 is connected to the nonvolatile resistive element R3, the source to the ground, and the gate to the write disable signal /WE. The drain of the NMOS transistor N38 is connected to the nonvolatile resistive element R4, the source to the ground, and the gate to the write disable signal /WE.

In the nonvolatile logic gate of the present exemplary embodiment, the circuit of FIG. 5B is used as a sense circuit 31. As the NMOS logic circuit 11, the circuit of FIG. 3 may be used.

Figure 16:
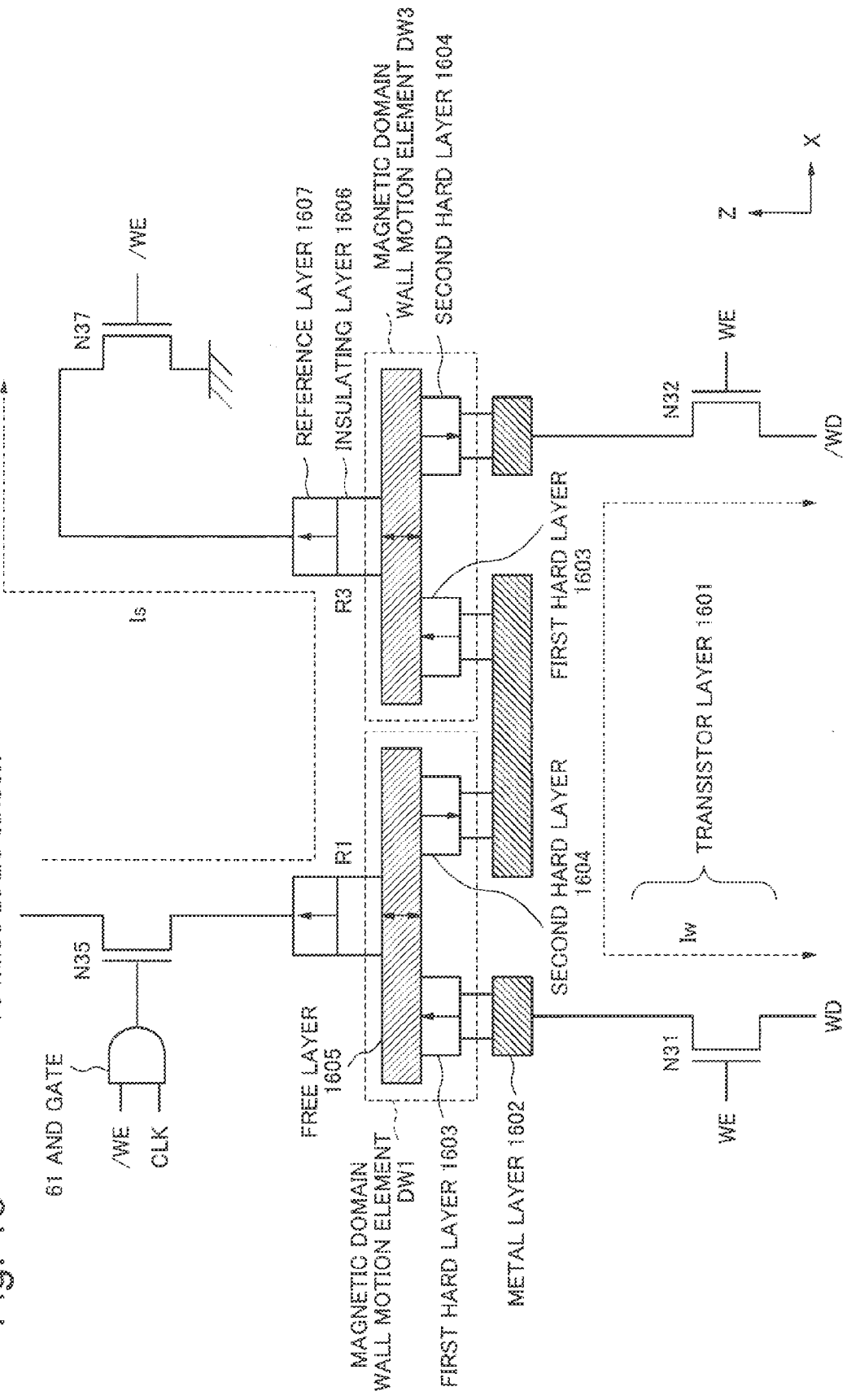
FIG. 16 a cross-sectional view of the nonvolatile resistor network assembly and the nonvolatile logic gate with high fault tolerance using the nonvolatile resistor network assembly, in the fourth exemplary embodiment of the present invention.
Figure 17:
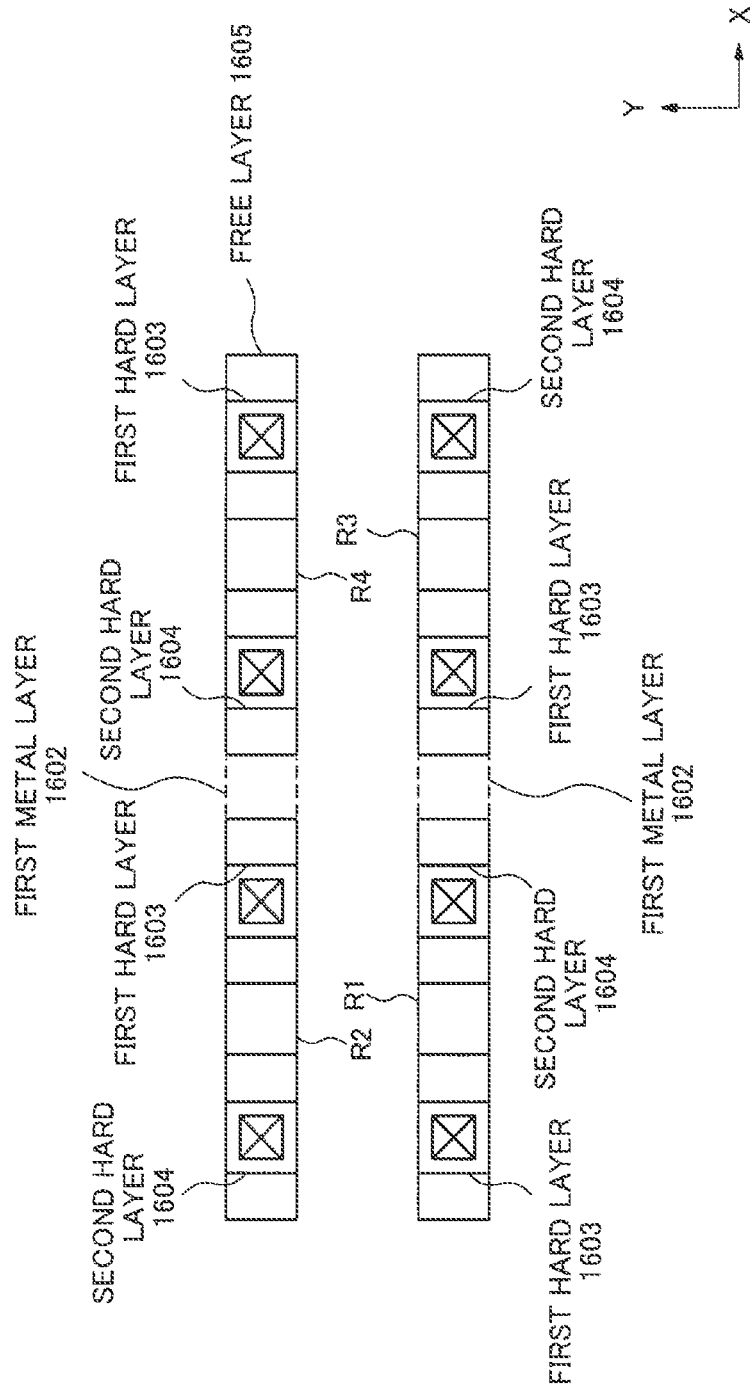
FIG. 17 a top view of the nonvolatile resistor network assembly and the nonvolatile logic gate with high fault tolerance using the nonvolatile resistor network assembly, in the fourth exemplary embodiment of the present invention.

FIG. 16 is a cross-sectional view of the vicinity of the nonvolatile resistive elements in the nonvolatile logic gate of the present exemplary embodiment. In FIG. 16, illustrated are, of FIG. 15, the AND gate 61, the nonvolatile resistive elements R1 and R3, the magnetic domain wall motion elements DW1 and DW3, and the NMOS transistors N31, N32, N35 and N37. FIG. 17 is a plan view of the nonvolatile logic gate of the present exemplary embodiment, where only the nonvolatile resistive elements R1 and R3 and the magnetic domain wall motion elements DW1 and DW3, of FIG. 15, are illustrated.

With reference to FIGS. 16 and 17, the structure of the nonvolatile logic gate of the present exemplary embodiment will be described below. The cross-sectional structure comprises, in order of closeness to the substrate, a transistor layer 1601 constituting a CMOS circuit, a first metal layer 1602, a first or a second hard layer 1603 or 1604, a free layer 1605, an insulating layer 1606 and a reference layer 1607. For example, magnetic thin films having perpendicular magnetic anisotropy are used for the free layer and the hard layer. The direction of magnetization in the first hard layer 1603 and that in the second hard layer 1604 are fixed to be opposite to each other. A spin torque effect is used for write operation. The magnetization in the free layer 1605 can be directed into either Z direction or −Z direction, depending on the direction of spin-polarized current as a write current Iw.

Via the NMOS transistor N31, the write current Iw flows into and through the free layer connected in series with the NMOS transistor N31. A read current Is flows through the sense circuit 31, the NMOS logic circuit 11, the NMOS transistor N35, the nonvolatile resistive elements R1 and R3 and the NMOS transistor N37, and then to the ground.

In the nonvolatile logic gate of the present exemplary embodiment, the AND gate 61 is added. The AND gate 61 is used to control the NMOS transistors N35 and N36 which connect the NMOS logic circuit 11 with the nonvolatile resistive elements. The AND gate 61 switches off the NMOS transistors N35 and N36 during the write operation so that no current flows from the sense circuit 31 to the nonvolatile resistive elements via the NMOS circuit 11. In this way, the amount of current on the write current path can be controlled precisely.

In the nonvolatile logic gate of the present exemplary embodiment, compared to the third exemplary embodiment, the number of metal layers between the free layer and the sense layer can be reduced by one. This reduction in the number of required metal layers leads to reduction in manufacturing process steps and cost.

Compared to the nonvolatile logic gate in FIG. 1, although the nonvolatile logic gate of the present exemplary embodiment requires addition of two nonvolatile resistive elements in order to increase fault tolerance, it is characterized by that writing into a plurality of nonvolatile resistive elements is performed at one time by supplying a write current passing serially through the plurality of nonvolatile resistive elements, and as a result, no additional write circuit is required, and accordingly the circuit area can be suppressed to be small. Simultaneously, the power consumption can be suppressed to be low. Additionally, because the above-described nonvolatile resistive elements are laid onto the CMOS circuit, increase in the circuit area can be suppressed.

As has been described above, the nonvolatile resistor network assembly and the nonvolatile logic gate using it, of the present exemplary embodiment, provide a nonvolatile logic gate with increased fault tolerance, while suppressing area increase and power consumption of the circuit.

Fifth Exemplary Embodiment

Figure 18:
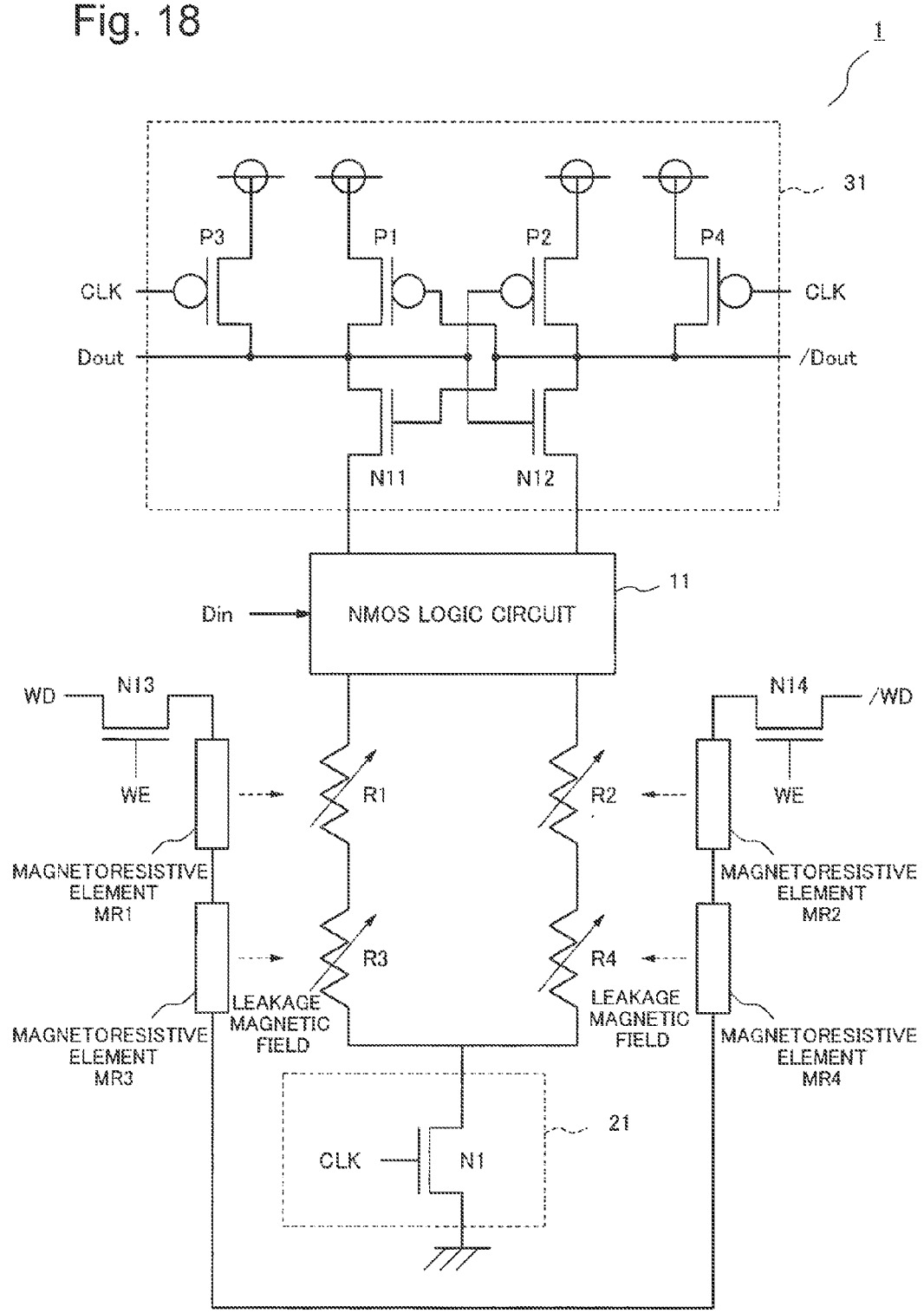
FIG. 18 a circuit diagram of a nonvolatile resistor network assembly and a nonvolatile logic gate with high fault tolerance using the nonvolatile resistor network assembly, in a fifth exemplary embodiment of the present invention.

FIG. 18 is a circuit diagram of a nonvolatile resistor network assembly and a nonvolatile logic gate 1 with high fault tolerance using the nonvolatile resistor network assembly, which are both according to a fifth exemplary embodiment of the present invention. The nonvolatile logic gate of the present exemplary embodiment is different from that of the third exemplary embodiment (FIG. 12) in that magnetoresistive elements MR1, MR2, MR3 and MR4 are used as a specific means for writing into nonvolatile resistive elements. Further, sense elements are used as the nonvolatile resistive elements R1, R2, R3 and R4.

More specifically, it comprises NMOS transistors N13 and N14, the magnetoresistive elements MR1, MR2, MR3 and MR4, complementary data input signals WD and /WD, and a write enable signal WE. The magnetoresistive elements each exert influence on the resistance of a corresponding one of the sense element through its leakage magnetic field.

A description will be given below of connection relationships in the write part of the present exemplary embodiment. The magnetoresistive elements MR1, MR2, MR3 and MR4 are connected in series together, and one end of the resultant network is connected to the NMOS transistor N13, and the other end to the NMOS transistor N14. The NMOS transistor 13 is connected to the write data terminal WD, and the NMOS transistor 14 to the write data terminal /WD. The gate of each of the NMOS transistors 13 and 14 is connected to the write enable signal WE.

The circuits of FIGS. 5B and 2A are used as a sense circuit 31 and a through current control circuit 21, respectively. The circuit of FIG. 3 may be used as an NMOS logic circuit 11.

Figure 19:
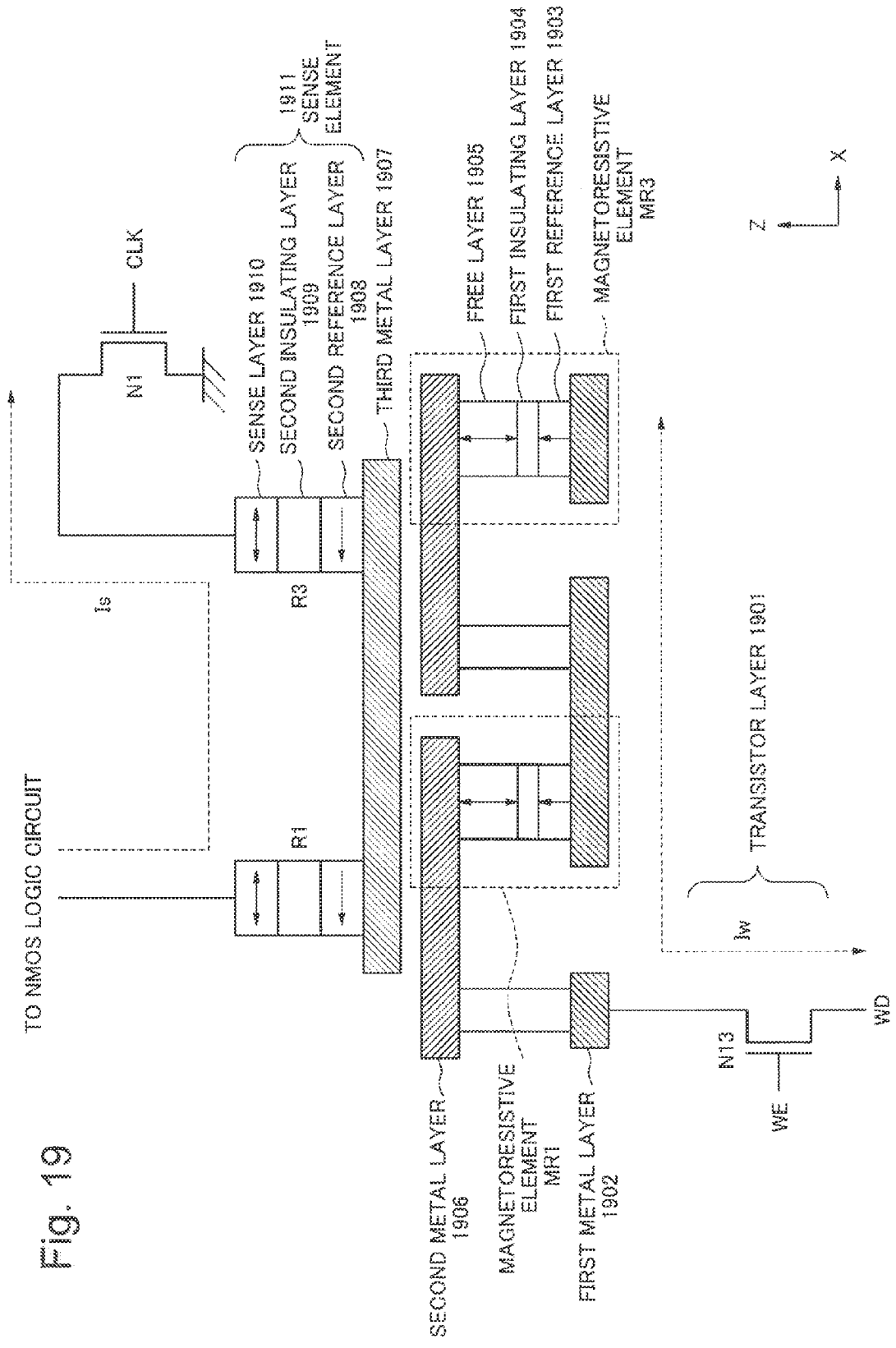
FIG. 19 a cross-sectional view of the nonvolatile resistor network assembly and the nonvolatile logic gate with high fault tolerance using the nonvolatile resistor network assembly, in the fifth exemplary embodiment of the present invention.

FIG. 19 is a cross-sectional view of the vicinity of the nonvolatile resistive elements in the nonvolatile logic gate of the present exemplary embodiment. In FIG. 19, illustrated are, of FIG. 18, the NMOS transistors N13 and N1, the magnetoresistive elements MR1 and MR3, and the sense elements R1 and R3. FIGS. 20A and 20B are plan views of the nonvolatile logic gate of the present exemplary embodiment, where only the magnetoresistive elements MR1 to MR4 and the sense elements R1 to R4 are illustrated. FIG. 20A shows an outline of a free layer and layers beneath it. FIG. 20B shows an outline of a sense layer and layers beneath it.

The magnetoresistive elements each comprise the free layer, a first insulating layer and a first reference layer. For example, magnetic thin films having perpendicular magnetic anisotropy are used for the free layer and the first reference layer. The first insulating layer between the first reference layer and the free layer may be replaced by a conductive layer. The sense elements each comprise the sense layer, a second insulating layer and a second reference layer. For example, magnetic thin films having in-plane magnetic anisotropy are used for the sense layer and the second reference layer.

With reference to FIG. 19, a description will be given below of the cross-sectional structure of the nonvolatile logic gate of the present exemplary embodiment. The cross-sectional structure comprises, in order of closeness to the substrate, a transistor layer 1901 constituting a CMOS circuit, a first metal layer 1902, the first reference layer 1903, the first insulating layer 1904, the free layer 1905, a second metal layer 1906, a third metal layer 1907, the second reference layer 1908, the second insulating layer 1909 and the sense layer 1910. The sense element 1911 may be formed alternatively by stacking, in order of closeness to the substrate, the sense layer, the second insulating layer and the second reference layer. The magnetoresistive elements may be formed alternatively by stacking, in order of closeness to the substrate, the free layer, the first insulating layer and the first reference layer. A spin torque effect is used for write operation. The magnetization in the free layer can be directed in either Z direction or −Z direction, depending on the flowing direction of write current. The sense elements are each located above the free layer, and can sense a leakage magnetic field from the free layer with high sensitivity. The sense elements may be arranged underneath the free layer.

In the nonvolatile logic gate of the present exemplary embodiment, a write current Iw flows, via the NMOS transistor N13, into and through the free layer 1905 connected in series with the NMOS transistor N13. The direction of magnetization in the free layer can be directed in either Z direction or −Z direction, depending on the direction of the write current Iw. A read current Is flows from the sense circuit 31 and the NMOS logic circuit 11, through the two sense elements R1 and R3 and the NMOS transistor N1, to the ground.

With reference to FIGS. 20A and 20B, a description will be given below of the lateral structure of the nonvolatile logic gate of the present exemplary embodiment. The magnetoresistive elements MR1, MR2, MR3 and MR4 are electrically connected in series together. Affected by a leakage magnetic field from the free layer 1905, the magnetization in the sense layer of each of the sense elements R1, R2, R3 and R4, which are arranged slightly deviating from the central axis of the corresponding free layer 1905, is directed in +X or −X direction. When the direction of the magnetization in the second reference layer 1908 of each of the sense elements is set to be −X direction and the magnetization in the free layer is directed in +Z direction, the sense elements R1, R2, R3 and R4 are in the low resistance state. When the direction of magnetization in the free layer is reversed, the resistance state of each of the sense elements is switched to the opposite state.

Compared to the nonvolatile logic gate in FIG. 1, although the nonvolatile logic gate of the present exemplary embodiment requires addition of two nonvolatile resistive elements in order to increase fault tolerance, it is characterized by that writing into a plurality of nonvolatile resistive elements is performed at one time by supplying a write current passing serially through the plurality of nonvolatile resistive elements, and as a result, no additional write circuit is required, and accordingly the circuit area can be suppressed to be small. Simultaneously, the power consumption can be suppressed to be low.

Compared to the third exemplary embodiment, the hard layers 1 and 2 used there are not necessary for the nonvolatile resistor network assembly and the nonvolatile logic gate using it, of the present exemplary embodiment. As a result, it becomes unnecessary to fabricate the hard layers 1 and 2 separately within the same layer, and accordingly the fabrication process becomes simple, which leads to improvement in yield and reduction in fabrication cost. Further, because the above-described nonvolatile resistive elements are laid onto the CMOS circuit, increase in the circuit area can be suppressed.

As has been described above, the nonvolatile resistor network assembly 51 and the nonvolatile logic gate using it, of the present exemplary embodiment, provide a nonvolatile logic gate with increased fault tolerance, while suppressing area increase and power consumption of the circuit.

Sixth Exemplary Embodiment

Figure 21:
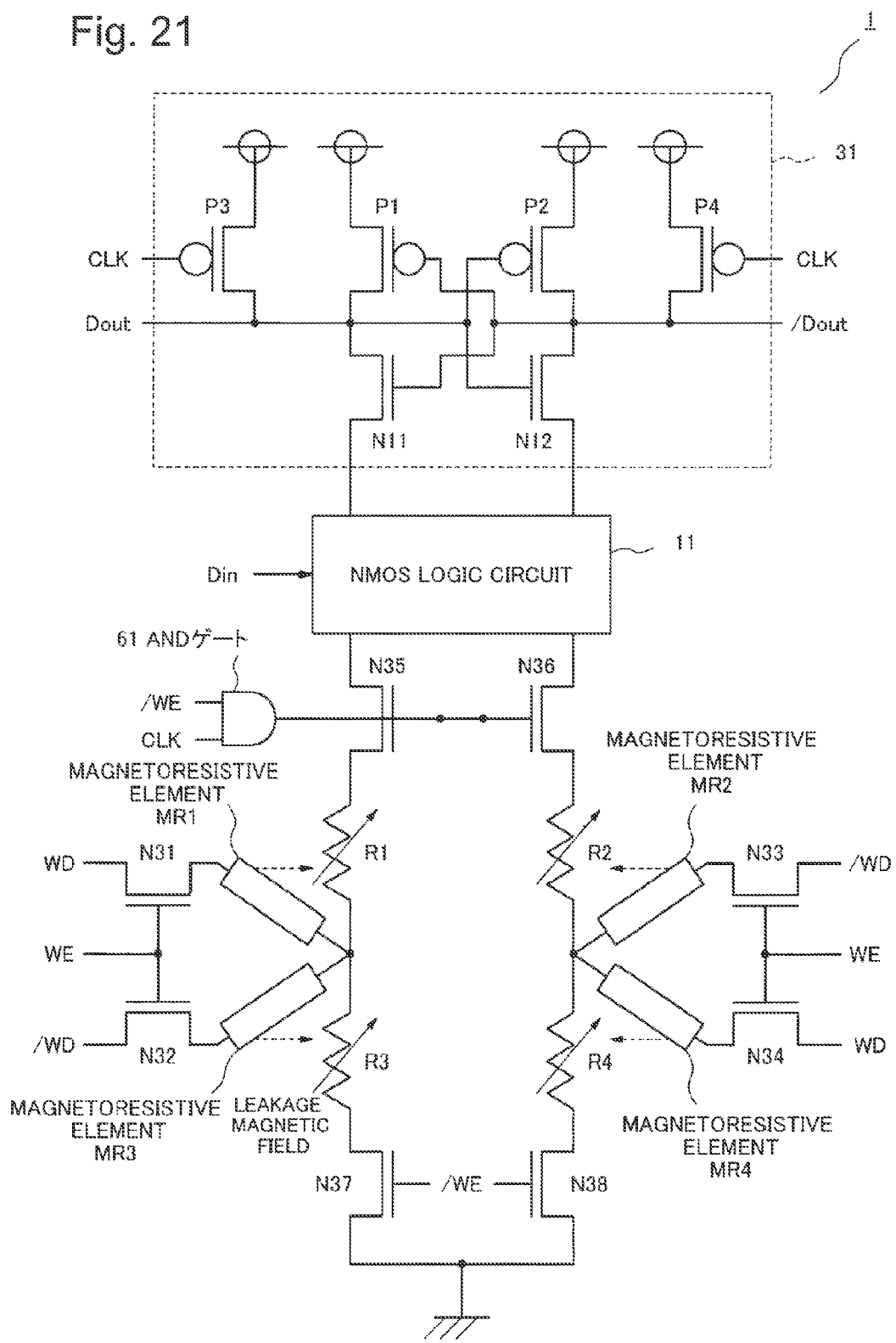
FIG. 21 a circuit diagram of a nonvolatile resistor network assembly and a nonvolatile logic gate with high fault tolerance using the nonvolatile resistor network assembly, in a sixth exemplary embodiment of the present invention.

FIG. 21 is a circuit diagram of a nonvolatile resistor network assembly and a nonvolatile logic gate with high fault tolerance using the nonvolatile resistor network assembly, which are both according to a sixth exemplary embodiment of the present invention. In the nonvolatile logic gate of the present exemplary embodiment, magnetoresistive elements MR1, MR2, MR3 and MR4 are used as a means for writing into nonvolatile resistive elements. Sense elements are used as nonvolatile resistive elements R1, R2, R3 and R4.

More specifically, the nonvolatile logic gate comprises NMOS transistors N31, N32, N33, N34, N35 and N36, an AND gate, complementary data input signals WD and /WD, and complementary write enable signals WE and /WE. Each of the magnetoresistive elements exerts influence on the resistance of a corresponding one of the sense elements through its leakage magnetic field.

A description will be given below of connection relationships in the write part of the present exemplary embodiment. One end of the nonvolatile resistive element R1 is connected to one end of the magnetoresistive element MR1, one end of the magnetoresistive element MR3 and one end of the nonvolatile resistive element R3, and the other end of the nonvolatile resistive element R1 is connected to the NMOS transistor N35. The other end of the magnetoresistive element MR1 is connected to the NMOS transistor N31. The other end of the magnetoresistive element MR3 is connected to the NMOS transistor N32. The other end of the nonvolatile resistive element R3 is connected to the NMOS transistor N37.

One end of the nonvolatile resistive element R2 is connected to one end of the magnetoresistive element MR2, one end of the magnetoresistive element MR4 and one end of the nonvolatile resistive element R4, and the other end of the nonvolatile resistive element R2 is connected to the NMOS transistor N36. The other end of the magnetoresistive element MR2 is connected to the NMOS transistor N33. The other end of the magnetoresistive element MR4 is connected to the NMOS transistor N34. The other end of the nonvolatile resistive element R4 is connected to the NMOS transistor N38.

One end of the NMOS transistor N31 is connected to the write data WD, the other end to the magnetoresistive element MR1, and the gate to the write enable signal WE. One end of the NMOS transistor N32 is connected to the write data /WD, the other end to the magnetoresistive element MR3, and the gate to the write enable signal WE.

One end of the NMOS transistor N33 is connected to the write data /WD, the other end to the magnetoresistive element MR2, and the gate to the write enable signal WE. One end of the NMOS transistor N34 is connected to the write data WD, the other end to the magnetoresistive element MR4, and the gate to the write enable signal WE.

The drain of the NMOS transistor N35 is connected to an NMOS logic circuit 11, the source to the nonvolatile resistance element R1, and the gate to the output of an AND gate 61 between the write disable signal /WE and a clock signal CLK. The drain of the NMOS transistor N36 is connected to the NMOS logic circuit 11, the source to the nonvolatile resistive element R2, and the gate to the output of the AND gate 61.

The drain of the NMOS transistor N37 is connected to the nonvolatile resistive element R3, the source to the ground, and the gate to the write disable signal /WE. The drain of the NMOS transistor N38 is connected to the nonvolatile resistive element R4, the source to the ground, and the gate to the write disable signal /WE.

In the nonvolatile logic gate of the present exemplary embodiment, the circuit of FIG. 5B is used as a sense circuit 31. As the NMOS logic circuit 11, the circuit of FIG. 3 may be used.

Figure 22:
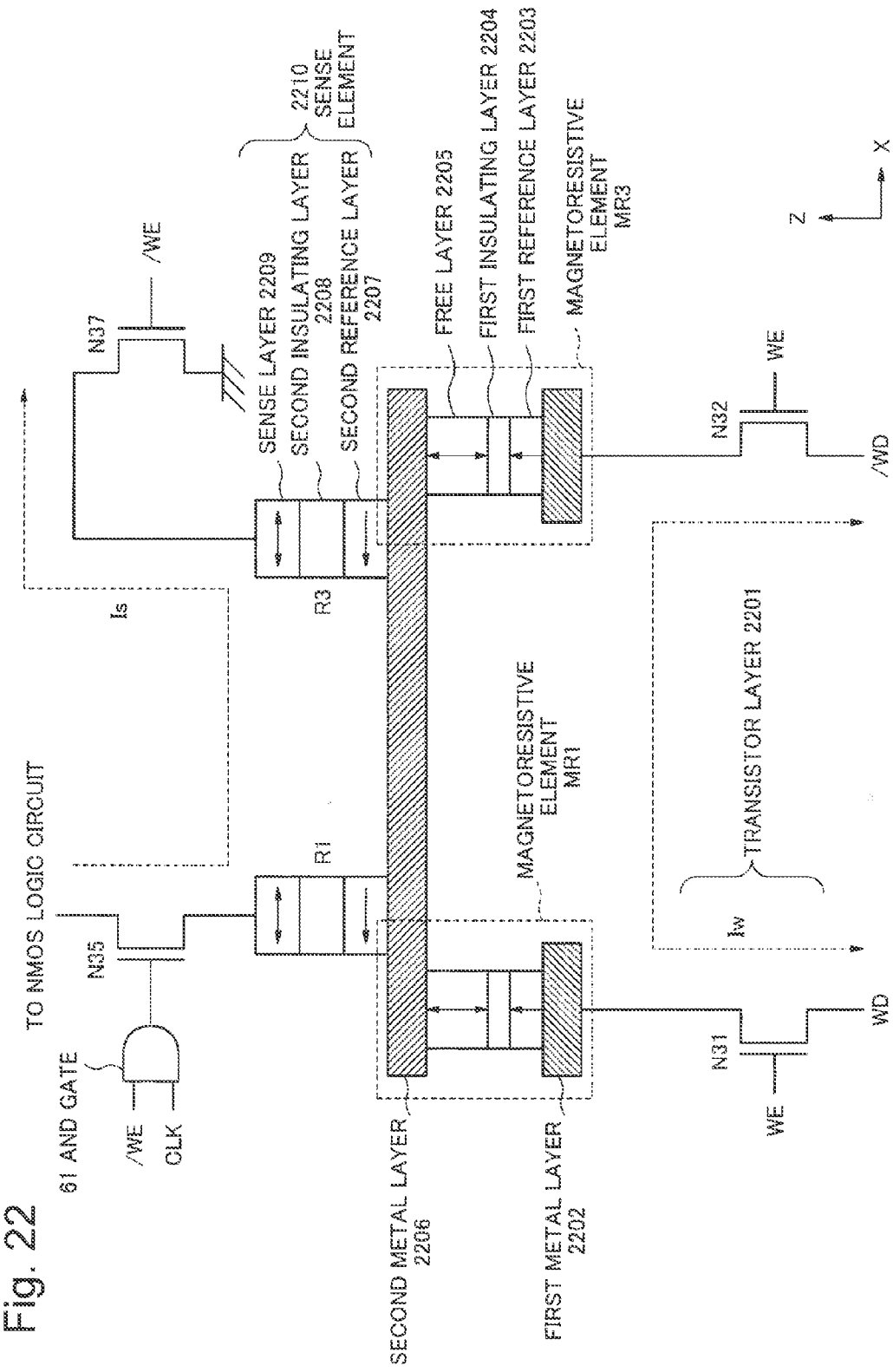
FIG. 22 a cross-sectional view of the nonvolatile resistor network assembly and the nonvolatile logic gate with high fault tolerance using the nonvolatile resistor network assembly, in the sixth exemplary embodiment of the present invention.
Figure 23:
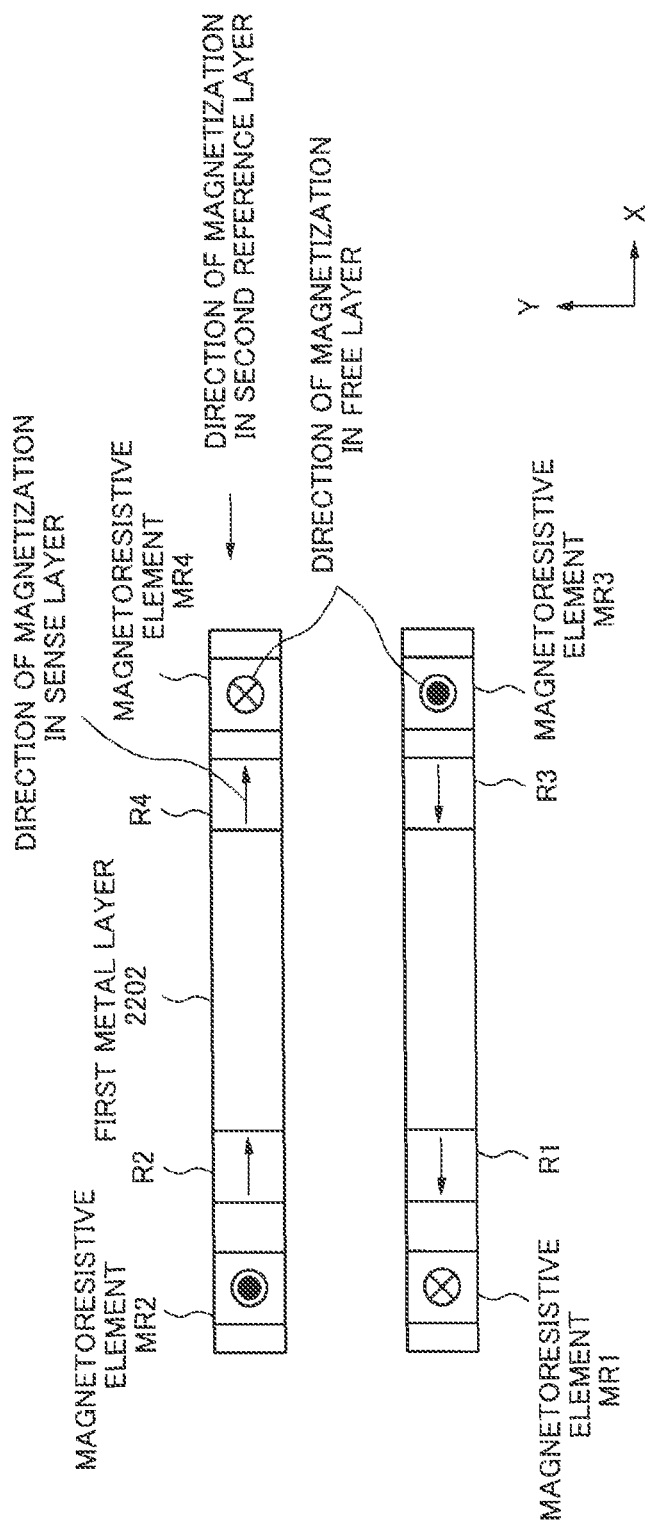
FIG. 23 a top view of the nonvolatile resistor network assembly and the nonvolatile logic gate with high fault tolerance using the nonvolatile resistor network assembly, in the sixth exemplary embodiment of the present invention.

FIG. 22 is a cross-sectional view of the vicinity of the nonvolatile resistive elements in the nonvolatile logic gate of the present exemplary embodiment. In FIG. 22, illustrated are the AND gate 61, the NMOS transistors N31, N32, N35 and N37, the sense elements R1 and R3, and the magnetoresistive element MR1 and MR3. FIG. 23 is a plan view of the nonvolatile logic gate of the present exemplary embodiment, where only the sense elements R1 to R4 and the magnetoresistive elements MR1 to MR4 are illustrated.

The magnetoresistive elements each comprise a free layer 2205, a first insulating layer 2204 and a first reference layer 2203. For example, magnetic thin films having perpendicular magnetic anisotropy are used for the free layer 2205 and the first reference layer 2203. The first insulating layer 2204 between the free layer 2205 and the first reference layer 2203 may be replaced by a conductive layer. The sense element 2210 comprises a sense layer 2209, a second insulating layer 2208 and a second reference layer 2207. For example, magnetic thin films having in-plane magnetic anisotropy are used for the sense layer 2209 and the second reference layer 2207.

With reference to FIG. 22, a description will be given below of the cross-sectional structure of the nonvolatile logic gate of the present exemplary embodiment. The cross-sectional structure comprises, in order of closeness to the substrate, a transistor layer 2201 constituting a CMOS circuit, a first metal layer 2202, the first reference layer 2203, the first insulating layer 2204, the free layer 2205, a second metal layer 2206, the second reference layer 2207, the second insulating layer 2208 and the sense layer 2209. The sense elements 2210 may be formed alternatively by stacking, in order of closeness to the substrate, the sense layer, the second insulating layer and the second reference layer. The magnetoresistive elements may be formed alternatively by stacking, in order of closeness to the substrate, the free layer, the first insulating layer and the first reference layer. A spin torque effect is used for write operation. The magnetization in the free layer can be directed in either Z direction or −Z direction, depending on the flowing direction of a write current Iw. The sense elements are each located above the free layer, and can sense a leakage magnetic field from the free layer with high sensitivity. The sense elements may be arranged underneath the free layer.

The write current Iw in the nonvolatile logic gate of the present exemplary embodiment is made to flow, by the use of the NMOS transistors N31 and N32, into and through the nonvolatile resistive elements MR1 and MR3 connected in series with the NMOS transistors N31 and N32. The direction of magnetization in the free layer can be directed in either Z direction or −Z direction, depending on the direction of the write current. A read current Is flows through the sense circuit 31, the NMOS logic circuit 11, the NMOS transistor N35, two sense elements and the NMOS transistor N37, and then to the ground.

With reference to FIG. 23, the lateral structure of the nonvolatile logic gate of the present exemplary embodiment will be described below. The magnetoresistive elements MR1 and MR3 are electrically connected in series with each other. The magnetoresistive elements MR2 and MR4 are electrically connected in series with each other. Affected by a leakage magnetic field from the free layer, the magnetization in the sense layer of each of the sense elements R1, R2, R3 and R4, which are arranged slightly deviating from the central axis of the corresponding free layer, is directed in +X or −X direction. When the direction of the magnetization in the second reference layer of each of the sense elements is set to be −X direction and the magnetization in the free layer is directed in +Z direction, the sense elements R3 and R4 are in the low resistance state, and the sense elements R1 and R2 are in the high resistance state. When the direction of magnetization in the free layer is reversed, the resistance state of each of the sense elements is switched to the opposite state.

In the nonvolatile logic gate of the present exemplary embodiment, as a result of thus changing the positional relationship between the magnetoresistive elements and the sense elements from that in the fifth exemplary embodiment, the number of metal layers between the free layer and the sense elements can be reduced by one. Because the resultant structure strengthens the magnetic coupling between the free layer and the sense layer, the sense layer of each of the sense elements can sense the direction of magnetization in the free layer with high sensitivity, which increases reliability of the reading. Further, the reduction in the number of required metal layers leads to reduction in manufacturing process steps and cost.

Compared to the nonvolatile logic gate in FIG. 1, although the nonvolatile logic gate of the present exemplary embodiment requires addition of two nonvolatile resistive elements in order to increase fault tolerance, it is characterized by that writing into a plurality of nonvolatile resistive elements is performed at one time by supplying a write current passing serially through the plurality of nonvolatile resistive elements, and as a result, no additional write circuit is required, and accordingly the circuit area can be suppressed to be small. Simultaneously, the power consumption can be suppressed to be low. Further, because the above-described nonvolatile resistive elements are laid onto the CMOS circuit, increase in the circuit area can be suppressed.

As has been described above, the nonvolatile resistor network assembly and the nonvolatile logic gate using it, of the present exemplary embodiment, provide a nonvolatile logic gate with increased fault tolerance, while suppressing area increase and power consumption of the circuit.

Seventh Exemplary Embodiment

Figure 24:
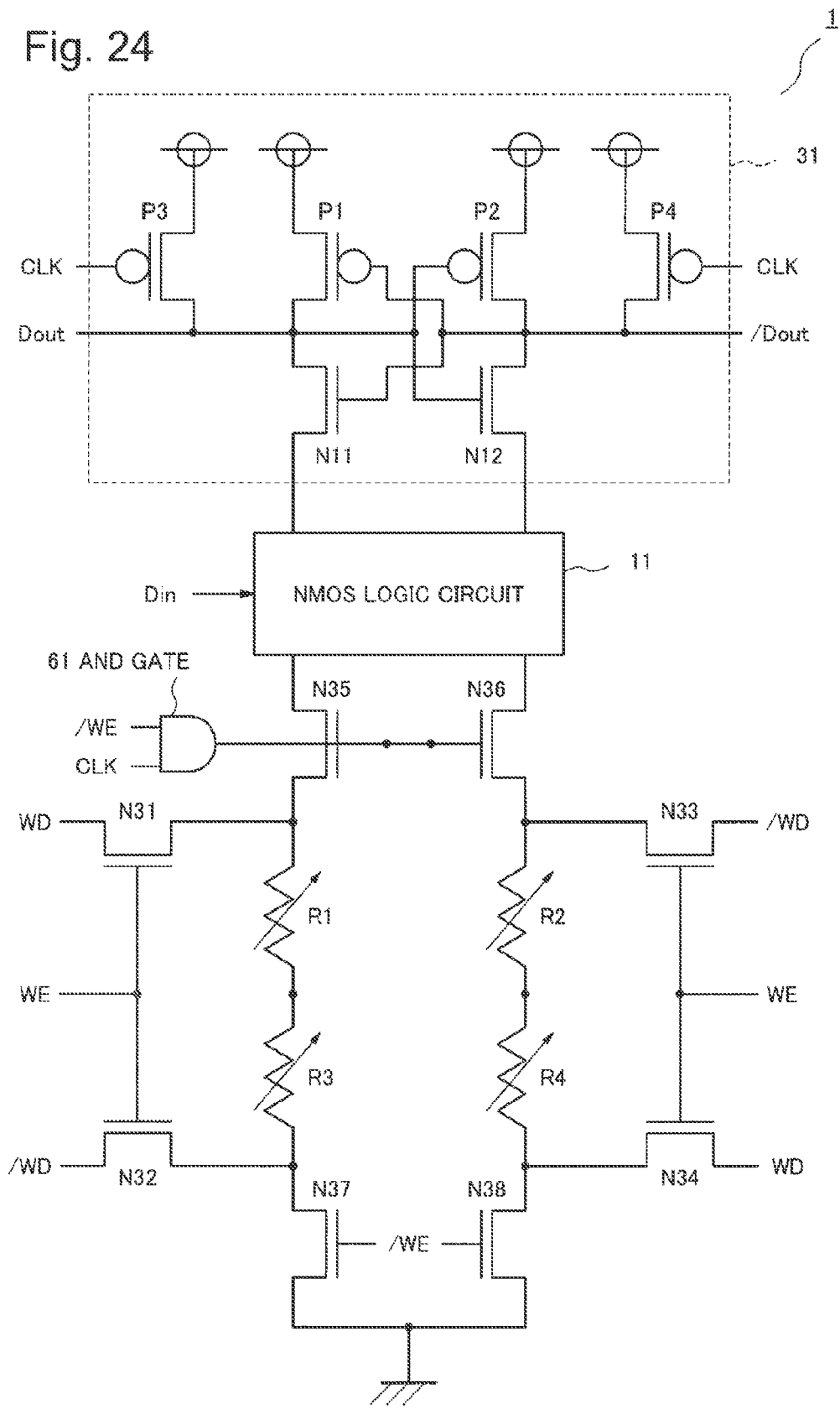
FIG. 24 a circuit diagram of a nonvolatile resistor network assembly and a nonvolatile logic gate with high fault tolerance using the nonvolatile resistor network assembly, in a seventh exemplary embodiment of the present invention.

FIG. 24 is a circuit diagram of a nonvolatile resistor network assembly and a nonvolatile logic gate 1 with high fault tolerance using the nonvolatile resistor network assembly, which are both according to a seventh exemplary embodiment of the present invention. The nonvolatile logic gate of the present exemplary embodiment uses a spin torque effect of nonvolatile resistive elements as a specific means for writing into the nonvolatile resistive elements. It comprises NMOS transistors N31, N32, N33, N34, N35 and N36, an AND gate, complementary data input signals WD and /WD, and complementary write enable signals WE and /WE.

A description will be given below of connection relationships in the write part of the present exemplary embodiment. Nonvolatile resistive elements R1 and R3 are connected in series with each other, and one end of the resultant network is connected to the NMOS transistors N31 and N35, and the other end to the NMOS transistors N32 and N37. Nonvolatile resistive elements R2 and R4 are connected in series with each other, and one end of the resultant network is connected to the NMOS transistors N33 and N36, and the other end to the NMOS transistors N34 and N38.

One end of the NMOS transistor N31 is connected to the write data WD, the other end to the nonvolatile resistive element R1, and the gate to the write enable signal WE. One end of the NMOS transistor N32 is connected to the write data /WD, the other end to the nonvolatile resistive element R3, and the gate to the write enable signal WE. One end of the NMOS transistor N33 is connected to the write data /WD, the other end to the nonvolatile resistive element R2, and the gate to the write enable signal WE. One end of the NMOS transistor N34 is connected to the write data WD, the other end to the nonvolatile resistive element R4, and the gate to the write enable signal WE.

The drain of the NMOS transistor N35 is connected to an NMOS logic circuit 11, the source to the nonvolatile resistance element R1, and the gate to the output of an AND gate 61 between the write disable signal /WE and a clock signal CLK. The drain of the NMOS transistor N36 is connected to the NMOS logic circuit 11, the source to the nonvolatile resistance element R2, and the gate to the output of the AND gate 61 between the write disable signal /WE and the clock signal CLK.

The drain of the NMOS transistor N37 is connected to the nonvolatile resistive element R3, the source to the ground, and the gate to the write disable signal /WE. The drain of the NMOS transistor N38 is connected to the nonvolatile resistive element R4, the source to the ground, and the gate to the write disable signal /WE.

In the nonvolatile logic gate of the present exemplary embodiment, the circuit of FIG. 5B is used as a sense circuit 31. As the NMOS logic circuit 11, the circuit of FIG. 3 may be used.

Figure 25:
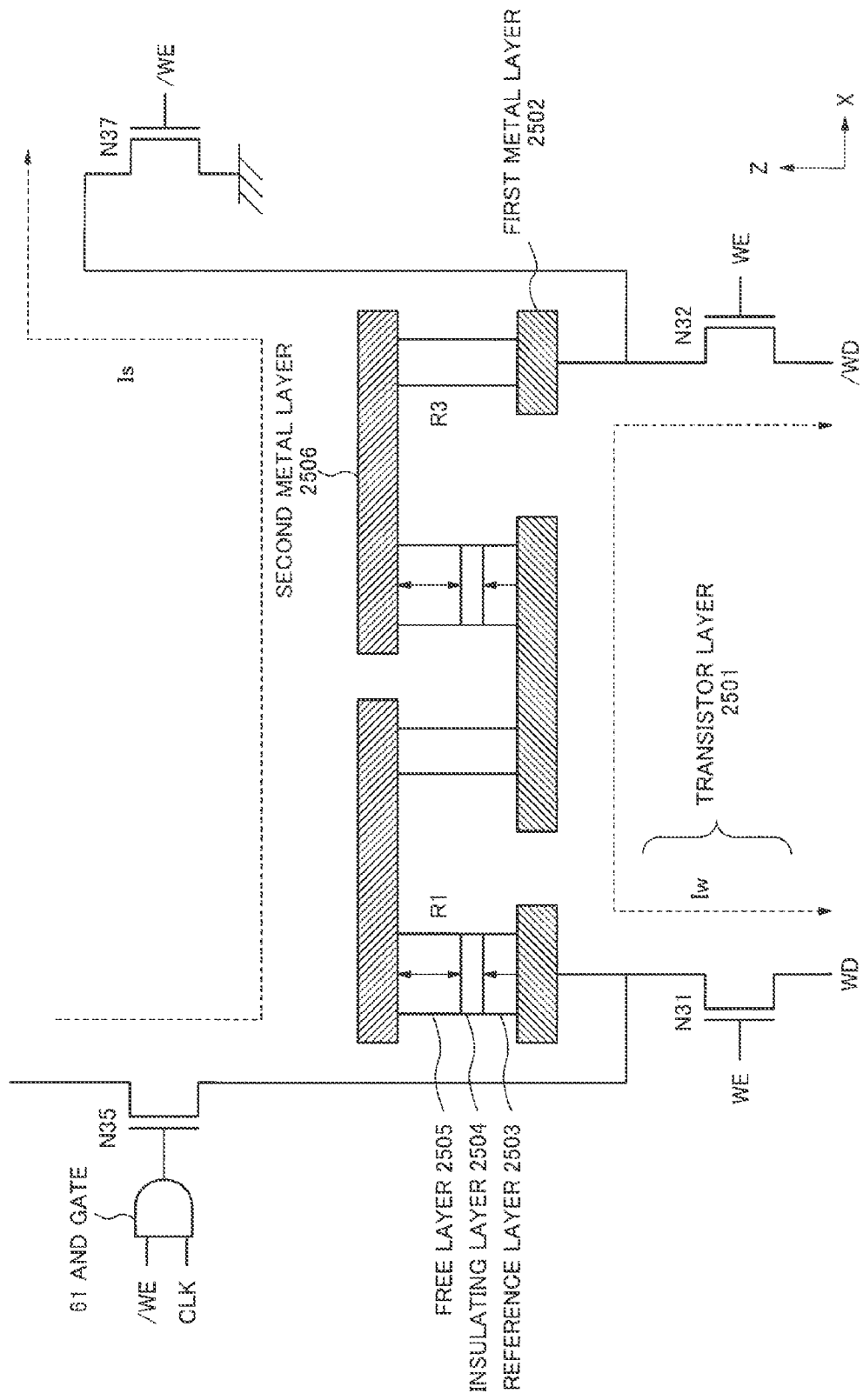
FIG. 25 a cross-sectional view of the nonvolatile resistor network assembly and the nonvolatile logic gate with high fault tolerance using the nonvolatile resistor network assembly, in the seventh exemplary embodiment of the present invention.
Figure 26:
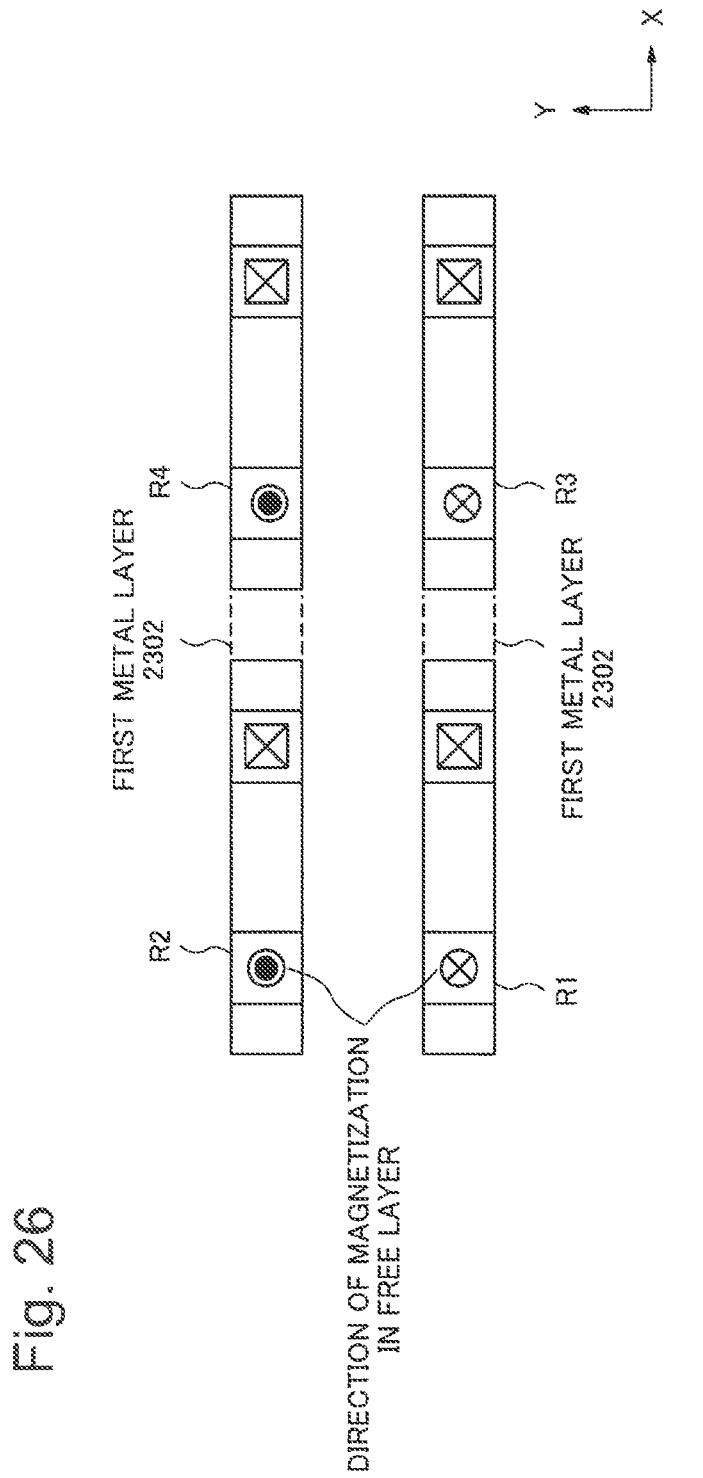
FIG. 26 a top view of the nonvolatile resistor network assembly and the nonvolatile logic gate with high fault tolerance using the nonvolatile resistor network assembly, in the seventh exemplary embodiment of the present invention.

FIG. 25 is a cross-sectional view of the vicinity of the nonvolatile resistive elements in the nonvolatile logic gate of the present exemplary embodiment. In FIG. 25, illustrated are the AND gate 61, the NMOS transistors N31, N32, N35 and N37, and the nonvolatile resistive elements R1 and R3. FIG. 26 is a plan view of the nonvolatile logic gate of the present exemplary embodiment, where the nonvolatile resistive elements and a first and a second metal layer are illustrated.

The nonvolatile resistive elements R1 and R3 each comprise a free layer 2505, an insulating layer 2504 and a reference layer 2503. For example, magnetic thin films having perpendicular magnetic anisotropy are used for the free layer and the reference layer. Alternatively, magnetic thin films having in-plane magnetic anisotropy may be used for the free layer and the reference layer.

With reference to FIG. 25, a description will be given below of the cross-sectional structure of the nonvolatile logic gate of the present exemplary embodiment. The cross-sectional structure comprises, in order of closeness to the substrate, a transistor layer 2501 constituting a CMOS circuit, the first metal layer 2502, the reference layer 2503, the insulating layer 2504, the free layer 2505 and the second metal layer 2506. The nonvolatile resistive elements may be formed alternatively by stacking, in order of closeness to the substrate, the free layer, the insulating layer and the reference layer. A spin torque effect is used for write operation. The magnetization in the free layer can be directed in either Z direction or −Z direction, depending on the flowing direction of a write current Iw.

The write current Iw in the nonvolatile logic gate of the present exemplary embodiment flows, through the NMOS transistors N35, into and through the nonvolatile resistive elements R1 and R3 connected in series with the NMOS transistors N35. The direction of magnetization in the free layer can be directed in either Z direction or −Z direction, depending on the direction of the write current Iw. A read current Is flows through the sense circuit 31, the NMOS logic circuit 11, the NMOS transistor N35, the two nonvolatile resistive elements R1 and R3, and the NMOS transistor N37, and then to the ground.

With reference to FIG. 26, the lateral structure of the nonvolatile logic gate of the present exemplary embodiment will be described below. The nonvolatile resistive elements R1 and R3 are electrically connected in series with each other. The nonvolatile resistive elements R2 and R4 are electrically connected in series with each other.

Compared to the nonvolatile logic gate in FIG. 1, although the nonvolatile logic gate of the present exemplary embodiment requires addition of two nonvolatile resistive elements in order to increase fault tolerance, it is characterized by that writing into a plurality of nonvolatile resistive elements is performed at one time by supplying a write current passing serially through the plurality of nonvolatile resistive elements, and as a result, no additional write circuit is required, and accordingly the circuit area can be suppressed to be small. Simultaneously, the power consumption is suppressed to be low. Furthermore, because the above-described nonvolatile resistive elements are laid onto the CMOS circuit, increase in the circuit area can be suppressed. Because the nonvolatile resistor network assembly and the nonvolatile logic gate using it, of the present exemplary embodiment, require no sense element, they can be manufactured with a reduced number of manufacturing process steps and at lower cost, compared to the sixth exemplary embodiment.

As has been described above, the nonvolatile resistor network assembly and the nonvolatile logic gate using it, of the present exemplary embodiment, provide a nonvolatile logic gate with increased fault tolerance, while suppressing area increase and power consumption of the circuit.

Eighth Exemplary Embodiment

Figure 27:
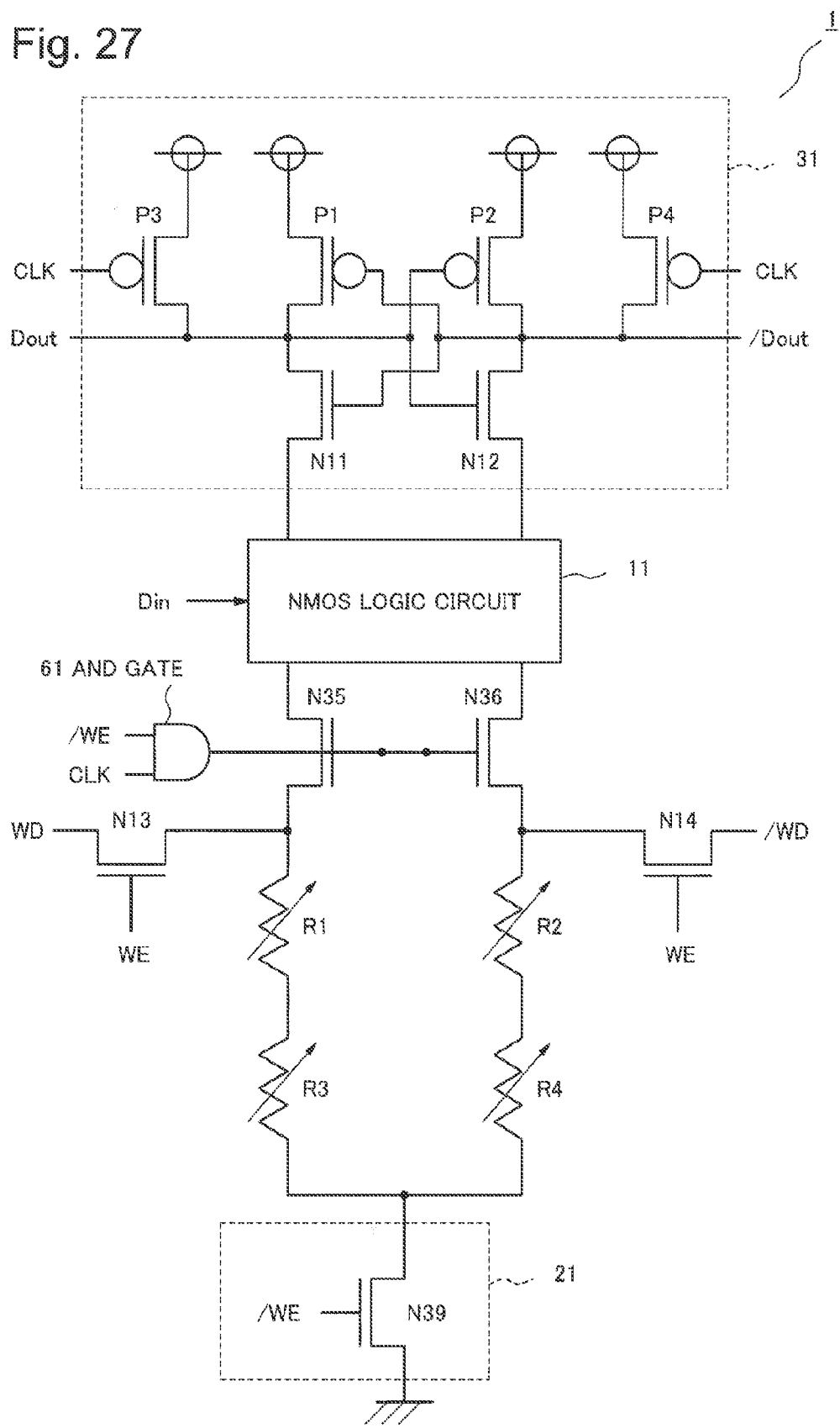
FIG. 27 a circuit diagram of a nonvolatile resistor network assembly and a nonvolatile logic gate with high fault tolerance using the nonvolatile resistor network assembly, in an eighth exemplary embodiment of the present invention.

FIG. 27 is a circuit diagram of a nonvolatile resistor network assembly and a nonvolatile logic gate 1 with high fault tolerance using the nonvolatile resistor network assembly, which are both according to an eighth exemplary embodiment of the present invention. The nonvolatile logic gate of the present exemplary embodiment uses a spin torque effect of nonvolatile resistive elements as a specific means for writing into the nonvolatile resistive elements. It comprises NMOS transistors N13, N14, N35, N36, and N39, an AND gate, complementary data input signals WD and /WD, and complementary write enable signals WE and /WE.

A description will be given below of connection relationships in the write part of the present exemplary embodiment. Nonvolatile resistive elements R1, R2, R3 and R4 are connected in series together, and one end of the resultant network is connected to the NMOS transistors N13 and N35, and the other end to the NMOS transistors N14 and N36.

One end of the NMOS transistor N13 is connected to the write data WD, the other end to the nonvolatile resistive element R1, and the gate to the write enable signal WE. One end of the NMOS transistor N14 is connected to the write data /WD, the other end to the nonvolatile resistive element R2, and the gate to the write enable signal WE.

The drain of the NMOS transistor N35 is connected to an NMOS logic circuit 11, the source to the nonvolatile resistive element R1, and the gate to the output of the AND gate 61 between the write disable signal /WE and a clock signal CLK. The drain of the NMOS transistor N36 is connected to the NMOS logic circuit 11, the source to the nonvolatile resistive element R2, and the gate to the output of the AND gate 61 between the write disable signal /WE and the clock signal CLK. The drain of the NMOS transistor N39 is connected to the nonvolatile resistive elements R3 and R4, the source to the ground, and the gate to the write disable signal /WE.

In the nonvolatile logic gate of the present exemplary embodiment, the circuit of FIG. 5B is used as a sense circuit 31. As the NMOS logic circuit 11, the circuit of FIG. 3 may be used.

FIG. 28 is a cross-sectional view of the vicinity of the nonvolatile resistive elements in the nonvolatile logic gate of the present exemplary embodiment. In FIG. 28, illustrated are the AND gate 61, the NMOS transistors N13, N35 and N39, and the nonvolatile resistive elements R1 and R3. FIG. 29 is a plan view of the nonvolatile logic gate of the present exemplary embodiment, where the nonvolatile resistive elements and a first and a second metal layer are illustrated.

The nonvolatile resistive elements R1 and R3 each comprise a free layer 2805, an insulating layer 2804 and a reference layer 2803. For example, magnetic thin films having perpendicular magnetic anisotropy are used for the free layer and the reference layer. Alternatively, magnetic thin films having in-plane magnetic anisotropy may be used for the free layer and the reference layer.

With reference to FIG. 28, a description will be given below of the cross-sectional structure of the nonvolatile logic gate of the present exemplary embodiment. The cross-sectional structure comprises, in order of closeness to the substrate, a transistor layer 2801 in which a CMOS circuit is formed, a first metal layer 2802, the reference layer 2803, the insulating layer 2804, the free layer 2805 and a second metal layer 2806. The nonvolatile resistive elements may be formed alternatively by stacking, in order of closeness to the substrate, the free layer, the insulating layer and the reference layer. A spin torque effect is used for write operation. The magnetization in the free layer can be directed in either Z direction or −Z direction, depending on the flowing direction of a write current Iw.

The write current Iw in the nonvolatile logic gate of the present exemplary embodiment flows, through the NMOS transistors N35, into and through the nonvolatile resistive elements R1 and R3 connected in series with the NMOS transistors N35. The direction of magnetization in the free layer can be directed in either Z direction or −Z direction, depending on the direction of the write current Iw. A read current Is flows through the sense circuit 31, the NMOS logic circuit 11, the NMOS transistor N35, the two nonvolatile resistive elements R1 and R3, and the NMOS transistor N39, and then to the ground.

With reference to FIG. 29, the lateral structure of the nonvolatile logic gate of the present exemplary embodiment will be described below. The nonvolatile resistive elements R1, R2, R3 and R4 are electrically connected in series together.

Compared to the nonvolatile logic gate in FIG. 1, although the nonvolatile logic gate of the present exemplary embodiment requires addition of two nonvolatile resistive elements in order to increase fault tolerance, it is characterized by that writing into a plurality of nonvolatile resistive elements is performed at one time by supplying a write current passing serially through the plurality of nonvolatile resistive elements, and as a result, no additional write circuit is required, and accordingly the circuit area can be suppressed to be small. Simultaneously, the power consumption is suppressed to be low. Further, because the above-described nonvolatile resistive elements are laid onto the CMOS circuit, increase in the circuit area can be suppressed.

In the nonvolatile resistor network assembly and the nonvolatile logic gate using it, of the present exemplary embodiment, the number of NMOS transistors for supplying the write current can be reduced, compared to the seventh exemplary embodiment As a result, it becomes possible to provide a nonvolatile logic gate with a reduced circuit area and low cost.

As has been described above, the nonvolatile resistor network assembly and the nonvolatile logic gate using it, of the present exemplary embodiment, provide a nonvolatile logic gate with increased fault tolerance, while suppressing area increase and power consumption of the circuit.

Although the present invention has been specifically described above on the basis of several exemplary embodiments, the present invention is not limited to the above-described exemplary embodiments. Various changes may be made to the exemplary embodiments within the range not departing from the spirit and scope of the present invention, and it is obvious that such modified examples are also embraced in the present invention.

SUPPLEMENTARY NOTE

Supplementary Note 1

A nonvolatile resistor network assembly comprising
a first and a second resistor network each composed of a plurality of nonvolatile resistive elements connected together, and a write means for writing into said first and second resistor networks, wherein
writing into said first and second resistor networks is performed by the use of said write means in a manner to make total resistance values of respectively said first and second resistor networks different from each other.

Supplementary Note 2

The nonvolatile resistor network assembly according to supplementary note 1, wherein said total resistance values are respectively a resistance value between the terminals of said first resistor network and that between the terminals of said second resistor network.

Supplementary Note 3

The nonvolatile resistor network assembly according to supplementary notes 1 or 2, wherein stored data is discriminated by the difference between the total resistance value of said first resistor network and that of said second resistor network.

Supplementary Note 4

The nonvolatile resistor network assembly according to supplementary notes 1, 2 or 3, wherein
by the use of said write means, data D is written into the nonvolatile resistive elements belonging to said first resistor network, and inverse data of the data D is written into the nonvolatile resistive elements belonging to said second resistor network.

Supplementary Note 5

The nonvolatile resistor network assembly according to supplementary notes 1, 2, 3 or 4, wherein each of said first and second resistor networks is one formed by connecting said plurality of nonvolatile resistive elements together in series, in parallel or in series-parallel.

Supplementary Note 6

The nonvolatile resistor network assembly according to supplementary notes 1, 2, 3, 4 or 5, wherein said write means comprises a circuit composed of magnetic domain wall motion elements connected in series together.

Supplementary Note 7

The nonvolatile resistor network assembly according to supplementary notes 1, 2, 3, 4 or 5, wherein said write means comprises a circuit composed of magnetoresistive elements connected in series together.

Supplementary Note 8

A nonvolatile logic gate which performs logical operation using stored data determined by total resistance values of respectively said first and second resistor networks in the nonvolatile resistor network assembly according to supplementary notes 1, 2, 3, 4, 5, 6 or 7.

Supplementary Note 9

The nonvolatile logic gate according to supplementary note 8 provided with:
a logic circuit which performs logical operation using stored data determined by total resistance values of respectively said first and second resistor networks; and
a sense circuit to which a result of said logical operation is inputted and from which complementary signals are outputted.

Supplementary Note 10

The nonvolatile logic gate according to supplementary notes 8 or 9 provided with a through current control circuit between one end of each of said first and second resistor networks and the ground.

Supplementary Note 11

A nonvolatile resistor network assembly comprising
a first resistor network composed of a plurality of nonvolatile resistive elements, a second resistor network composed of a plurality of nonvolatile resistive elements, a third resistor network composed of a plurality of nonvolatile resistive elements, and a write circuit, wherein:
said nonvolatile resistive elements comprise a first and a second read terminal and a first and a second write terminal;
said first resistor network is formed by connecting the read terminals of said nonvolatile resistive elements together;
said second resistor network is formed by connecting the read terminals of said nonvolatile resistive elements together;
said third resistor network is formed by connecting the write terminals of said nonvolatile resistive elements together;
a logical value is determined by a total resistance value of said first resistor network and that of said second resistor network;
said write circuit comprises a first and a second terminal for supplying or terminating write current, and when one of the terminals supplies the write current, the other terminal terminates it; and
said write circuit is connected to said third resistor network and writes into said plurality of nonvolatile resistive elements.

Supplementary Note 12

The nonvolatile resistor network assembly according to supplementary note 11, wherein:
said first or second resistor network is composed of nonvolatile resistive elements connected together in series, in parallel or in series-parallel; and
said third resistor network is composed of nonvolatile resistive elements connected together in series.

Supplementary Note 13

The nonvolatile resistor network assembly according to supplementary note 12, wherein
resistance data D is written into the nonvolatile resistive elements belonging to said first resistor network, and inverse data of the resistance data D is written into the nonvolatile resistive elements belonging to said second resistor network.

Supplementary Note 14

The nonvolatile resistor network assembly according to supplementary note 13, wherein
writing into the nonvolatile resistive elements is performed by a spin torque effect.

Supplementary Note 15

The nonvolatile resistor network assembly according to supplementary note 14 further comprising sense elements, wherein:
data in the sense elements is rewritten through a leakage magnetic field from a magnetic layer written by a spin torque effect; and
a write current path and a read current path are electrically separated from each other.

Supplementary Note 16

The nonvolatile resistor network assembly according to supplementary note 13 comprising a plurality of write circuits, wherein:
said second read terminal and second write terminal of the nonvolatile resistive elements are the same terminal; and
one write circuit is provided for every two nonvolatile magnetoresistive elements.

Supplementary Note 17

A nonvolatile resistor network assembly according to supplementary note 13, wherein:
said first read terminal and said first write terminal of the nonvolatile resistive elements are the same terminal; and
said second read terminal and said second write terminal of the nonvolatile resistive elements are the same terminal.

Supplementary Note 18

The nonvolatile resistor network assembly according to supplementary note 13 comprising a first, a second, a third and a fourth nonvolatile resistive element, a first, a second, a third and a fourth sense element, and a write circuit, wherein:
the first to fourth nonvolatile resistive elements each comprise a first and a second terminal;
the first terminal of the first nonvolatile resistive element is connected with the first terminal of the write circuit, and the second terminal of the first nonvolatile resistive element is connected with the first terminal of the third nonvolatile resistive element;
the second terminal of the third nonvolatile resistive element is connected with the second terminal of the fourth nonvolatile resistive element, and the first terminal of the fourth nonvolatile resistive element is connected with the second terminal of the second nonvolatile resistive element;
the first terminal of the second nonvolatile resistive element is connected with the second terminal of the write circuit;
the first to fourth nonvolatile resistive elements are electrically separated from the first to fourth sense elements;
the first sense element senses resistance data in the first nonvolatile resistive element through a leakage magnetic field;
the second sense element senses resistance data in the second nonvolatile resistive element through a leakage magnetic field;
the third sense element senses resistance data in the third nonvolatile resistive element through a leakage magnetic field;
the fourth sense element senses resistance data in the fourth nonvolatile resistive element through a leakage magnetic field; and
stored data is discriminated by comparing a first total resistance, which is a total resistance of the first and third sense elements, with a second total resistance, which is a total resistance of the second and fourth sense elements.

Supplementary Note 19

The nonvolatile resistor network assembly according to supplementary note 13 comprising a first, a second, a third and a fourth nonvolatile resistive element, and a write circuit, wherein:
the first to fourth nonvolatile resistive elements each comprise a first and a second terminal;
the first terminal of the first nonvolatile resistive element is connected with the first terminal of the write circuit;
the second terminal of the first nonvolatile resistive element is connected with the first terminal of the third nonvolatile resistive element;
the second terminal of the third nonvolatile resistive element is connected with the second terminal of the fourth nonvolatile resistive element;
the first terminal of the fourth nonvolatile resistive element is connected with the second terminal of the second nonvolatile resistive element;
the first terminal of the second nonvolatile resistive element is connected with the second terminal of the write circuit; and
stored data is discriminated by comparing a first total resistance, which is a total resistance of the first and third nonvolatile resistive elements, with a second total resistance, which is a total resistance of the second and fourth nonvolatile resistive elements.

Supplementary Note 20

The nonvolatile resistor network assembly according to supplementary note 13 comprising a first, a second, a third and a fourth nonvolatile resistive element, and a first and a second write circuit, wherein:
the first to fourth nonvolatile resistive elements each comprise a first and a second terminal;
the first terminal of the first nonvolatile resistive element is connected with the first terminal 1 of the first write circuit;
the second terminal of the first nonvolatile resistive element is connected with the first terminal of the third nonvolatile resistive element;
the second terminal of the third nonvolatile resistive element is connected with the second terminal of the first write circuit;
the first terminal of the second nonvolatile resistive element is connected with the first terminal of the second write circuit;
the second terminal of the second nonvolatile resistive element is connected with the first terminal of the fourth nonvolatile resistive element;
the second terminal of the fourth nonvolatile resistive element is connected with the second terminal of the second write circuit; and
stored data is discriminated by comparing a first total resistance, which is a total resistance of the first and third nonvolatile resistive elements, with a second total resistance, which is a total resistance of the second and fourth nonvolatile resistive elements.

Supplementary Note 21

The nonvolatile resistor network assembly according to supplementary note 13 comprising a first, a second, a third and a fourth nonvolatile resistive element, and a first and a second write circuit, wherein:
the first to fourth nonvolatile resistive elements each comprise a first and a second terminal;
the first terminal of the first nonvolatile resistive element is connected with the first terminal 1 of the first write circuit;
the second terminal of the first nonvolatile resistive element is connected with the first terminal of the third nonvolatile resistive element;
the second terminal of the third nonvolatile resistive element is connected with the second terminal of the first write circuit;
the first terminal of the second nonvolatile resistive element is connected with the first terminal of the second write circuit;
the second terminal of the second nonvolatile resistive element is connected with the first terminal of the fourth nonvolatile resistive element;

the second terminal of the fourth nonvolatile resistive element is connected with the second terminal of the second write circuit; and stored data is discriminated by comparing a first total resistance, which is a total resistance of a resistance between a third and the second terminals of the first nonvolatile resistive element and a resistance between a third and the first terminals of the third nonvolatile resistive element, with a second total resistance, which is a total resistance of a resistance between a third and the second terminals of the second nonvolatile resistive element and a resistance between a third and the first terminals of the fourth nonvolatile resistive element.

Supplementary Note 22

The nonvolatile resistor network assembly according to supplementary note 13 comprising a first, a second, a third and a fourth nonvolatile resistive element; a first, a second, a third and a fourth sense element; and a first and second write circuit; wherein:

the first to fourth nonvolatile resistive elements each comprise a first and a second terminal;

the first terminal of the first nonvolatile resistive element is connected with the first terminal of the first write circuit;

the second terminal of the first nonvolatile resistive element is connected with the first terminal of the third nonvolatile resistive element;

the second terminal of the third nonvolatile resistive element is connected with the second terminal of the first write circuit;

the first terminal of the second nonvolatile resistive element is connected with the first terminal of the second write circuit;

the second terminal of the second nonvolatile resistive element is connected with the first terminal of the fourth nonvolatile resistive element;

the second terminal of the fourth nonvolatile resistive element is connected with the second terminal of the second write circuit;

the first to fourth sense elements each comprise a first and second terminal;

the second terminal of the first sense element is connected with the second terminal of the first nonvolatile resistive element;

the first terminal of the third sense element is connected with the second terminal of the first nonvolatile resistive element;

the second terminal of the second sense element is connected with the second terminal of the second nonvolatile resistive element;

the second terminal of the fourth sense element is connected with the second terminal of the second nonvolatile resistive element;

the first sense element senses resistance data in the first nonvolatile resistive element through a leakage magnetic field;

the second sense element senses resistance data in the second nonvolatile resistive element through a leakage magnetic field;

the third sense element senses resistance data in the third nonvolatile resistive element through a leakage magnetic field;

the fourth sense element senses resistance data in the fourth nonvolatile resistive element through a leakage magnetic field; and stored data is discriminated by comparing a first total resistance, which is a total resistance of the first and third sense elements, with a second total resistance, which is a total resistance of the second and fourth sense elements.

Supplementary Note 23

A nonvolatile logic gate which performs logical operation using stored data determined by the total resistances respectively of said resistor networks in the nonvolatile resistor network assembly according to supplementary notes 11, 12, 13, 14, 15, 16, 17, 18, 19, 20, 21 or 22.

Supplementary Note 24

The nonvolatile logic gate according to supplementary note 23 provided with:

a logic circuit which performs logical operation using stored data determined by the total resistance values respectively of said resistor networks; and a sense circuit to which a result of said logical operation is inputted and from which complementary signals are outputted.

Supplementary Note 25

A nonvolatile logic gate according to supplementary notes 23 or 24 provided with a through current control circuit between one end of each of said plurality of resistor networks and the ground.

This application is based upon and claims the benefit of priority from Japanese Patent Application No. 2011-210552, filed on Sep. 27, 2011, the disclosure of which is incorporated herein in its entirety by reference.

INDUSTRIAL APPLICABILITY

The present invention relates to a nonvolatile resistor network assembly using a variable resistance element such as a magnetic tunnel junction element, and also to a nonvolatile logic gate using the nonvolatile resistor network assembly.

REFERENCE SIGNS LIST 1 nonvolatile logic gate
11 NMOS logic circuit
21 through current control circuit
31 sense circuit
41 write circuit
51 nonvolatile resistor network assembly
61 AND gate

The invention claimed is:
1. A nonvolatile resistor network assembly comprising
a first and a second resistor network each composed of a plurality of nonvolatile resistive elements connected together, and a write unit for writing into said first and second resistor networks, wherein
writing into said first and second resistor networks is performed by the use of said write unit in a manner to make total resistance values of respectively said first and second resistor networks different from each other,
wherein said write unit comprises a circuit composed of magnetic domain wall motion elements connected in series together.
2. The nonvolatile resistor network assembly according to claim 1, wherein said total resistance values are respectively a resistance value between the terminals of said first resistor network and that between the terminals of said second resistor network.

3. The nonvolatile resistor network assembly according to claim 1, wherein stored data is discriminated by the difference between the total resistance value of said first resistor network and that of said second resistor network.

4. The nonvolatile resistor network assembly according to claim 1, wherein, by the use of said write unit, data D is written into the nonvolatile resistive elements belonging to said first resistor network, and inverse data of the data D is written into the nonvolatile resistive elements belonging to said second resistor network.

5. The nonvolatile resistor network assembly according to claim 1, wherein each of said first and second resistor networks is one formed by connecting said plurality of nonvolatile resistive elements together in series, in parallel or in series-parallel.

6. A nonvolatile logic gate which performs logical operation using stored data determined by total resistance values of respectively said first and second resistor networks in the nonvolatile resistor network assembly according to claim 1.

7. The nonvolatile logic gate according to claim 6 provided with:
   a logic circuit which performs logical operation using stored data determined by total resistance values of respectively said first and second resistor networks; and
   a sense circuit to which a result of said logical operation is inputted and from which complementary signals are outputted.

8. The nonvolatile logic gate according to claim 6 provided with a through current control circuit between one end of each of said first and second resistor networks and the ground.

9. A nonvolatile resistor network assembly comprising
   a first and a second resistor network each composed of a plurality of nonvolatile resistive elements connected together, and a write unit for writing into said first and second resistor networks, wherein
   writing into said first and second resistor networks is performed by the use of said write unit in a manner to make total resistance values of respectively said first and second resistor networks different from each other,
   wherein said write unit comprises a circuit composed of magnetoresistive elements connected in series together.

10. The nonvolatile resistor network assembly according to claim 9, wherein said total resistance values are respectively a resistance value between the terminals of said first resistor network and that between the terminals of said second resistor network.

11. The nonvolatile resistor network assembly according to claim 9, wherein stored data is discriminated by the difference between the total resistance value of said first resistor network and that of said second resistor network.

12. The nonvolatile resistor network assembly according to claim 9, wherein, by the use of said write unit, data D is written into the nonvolatile resistive elements belonging to said first resistor network, and inverse data of the data D is written into the nonvolatile resistive elements belonging to said second resistor network.

13. The nonvolatile resistor network assembly according to claim 9, wherein each of said first and second resistor networks is one formed by connecting said plurality of nonvolatile resistive elements together in series, in parallel or in series-parallel.

14. A nonvolatile logic gate which performs logical operation using stored data determined by total resistance values of respectively said first and second resistor networks in the nonvolatile resistor network assembly according to claim 9.

15. The nonvolatile logic gate according to claim 14 provided with:
   a logic circuit which performs logical operation using stored data determined by total resistance values of respectively said first and second resistor networks; and
   a sense circuit to which a result of said logical operation is inputted and from which complementary signals are outputted.

16. The nonvolatile logic gate according to claim 14 provided with a through current control circuit between one end of each of said first and second resistor networks and the ground.

\* \* \* \* \*